(12) United States Patent
Liu et al.

(10) Patent No.: US 11,616,171 B2
(45) Date of Patent: Mar. 28, 2023

(54) FLIP LIGHT EMITTING CHIP AND MANUFACTURING METHOD THEREOF

(71) Applicant: XIAMEN CHANGELIGHT CO., LTD., Fujian (CN)

(72) Inventors: Yingce Liu, Xiamen (CN); Zhao Liu, Xiamen (CN); Junxian Li, Xiamen (CN); Zhendong Wei, Xiamen (CN); Xingen Wu, Xiamen (CN)

(73) Assignee: Xiamen Changelight Co., Ltd., Fujian (CN)

( * ) Notice: Subject to any disclaimer, the term of this patent is extended or adjusted under 35 U.S.C. 154(b) by 250 days.

(21) Appl. No.: 16/625,768

(22) PCT Filed: Aug. 14, 2019

(86) PCT No.: PCT/CN2019/100574
§ 371 (c)(1),
(2) Date: Apr. 1, 2020

(87) PCT Pub. No.: WO2020/034994
PCT Pub. Date: Feb. 20, 2020

(65) Prior Publication Data
US 2021/0343904 A1    Nov. 4, 2021

(30) Foreign Application Priority Data

Aug. 15, 2018   (CN) .......................... 201810927204.8

(51) Int. Cl.
*H01L 33/38*  (2010.01)
*H01L 33/00*  (2010.01)
*H01L 33/60*  (2010.01)

(52) U.S. Cl.
CPC ........ *H01L 33/382* (2013.01); *H01L 33/0008* (2013.01); *H01L 33/0095* (2013.01); *H01L 33/60* (2013.01); *H01L 2933/0016* (2013.01)

(58) Field of Classification Search
CPC ............... H01L 33/382; H01L 33/0008; H01L 33/0095; H01L 33/60; H01L 2933/0016
See application file for complete search history.

(56) References Cited

U.S. PATENT DOCUMENTS

| | | | |
|---|---|---|---|
| 2015/0125976 A1* | 5/2015 | Wang ................ | H01L 21/02381 438/26 |
| 2016/0260869 A1* | 9/2016 | Jeon ....................... | H01L 33/38 |

(Continued)

*Primary Examiner* — Feifei Yeung Lopez
(74) *Attorney, Agent, or Firm* — Arch & Lake LLP

(57) ABSTRACT

A flip light emitting chip and a manufacturing method thereof are disclosed, wherein the flip light emitting chip comprises an N-type semiconductor layer, an active region, a P-type semiconductor layer, a reflective layer, a barrier layer, a bonding layer, a first insulating layer, an extended electrode layer, a second insulating layer, an N-type electrode, and a P-type electrode sequentially grown from a substrate. The first insulating layer has at least one first channel and at least one second channel. A first extended electrode portion and a second extended electrode portion of the extended electrode layer are respectively formed on the first insulating layer and extended to the N-type semiconductor layer via the first channel and to the barrier layer via the second channel. The second insulating layer has at least one third channel and at least one fourth channel. The N-type electrode extends to the first extended electrode portion through the third channel and the P-type electrode extends to the second extended electrode portion through the fourth channel.

25 Claims, 12 Drawing Sheets

(56) References Cited

U.S. PATENT DOCUMENTS

2016/0284940 A1* 9/2016 Kawaguchi ........... H01L 33/382
2017/0141260 A1* 5/2017 Chen .................... H01L 33/382

* cited by examiner

FLIP LIGHT EMITTING CHIP AND MANUFACTURING METHOD THEREOF

CROSS REFERENCE OF RELATED APPLICATION

This application is a non-provisional application that claims the benefit of priority under 35 U.S.C. § 371 to PCT application, application number PCT/CN2019/100574, filed Aug. 14, 2019, which is incorporated herewith by reference in its entity.

BACKGROUND OF THE PRESENT INVENTION

Field of Invention

The present invention relates to semiconductor light emitting diode, and, in particular, to a flip light emitting chip and manufacturing method thereof.

Description of Related Arts

In recent years, the flip chip of light emitting diode and relative technologies have made a spurt of progress. Based on different reflecting materials of the flip chip, flip chips can be categorized into ITO+DBR reflection structural flip chips and metallic reflection structural (such as Ag/Al) flip chips. Because the metallic reflection structures (especially for Ag metallic reflection structures) have higher reflectance for visible lights, metallic reflection structures are commonly utilized for the flip chips. In addition, based on different numbers of the insulating layer of the flip chip, flip chips may also be categorized into single ISO (insulating barrier layer) structural flip chips and dual-ISO structural flip chips. Comparing with single ISO structural flip chips, electric current can be expanded more even and uniform for dual-ISO structural flip chips, which provides better luminous efficacy and are widely utilized in vehicle illumination.

FIG. 1 is a sectional view of a conventional dual-ISO structural flip chip, wherein the flip chip is manufactured through nine photoetching processes. Specifically speaking, the flip chip comprises a substrate 10P, an extended stacking layer 20P, a reflective layer 30P, a barrier layer 40P, an N-ohm contact layer 50P, a first insulating layer 60P, an extended electrode layer 70P, a second insulating layer 80P, and an electrode set 90P. The extended stacking layer 20P comprises an N-type semiconductor layer 21P, an active region 22P and a P-type semiconductor layer 23P, wherein the substrate 10P, the N-type semiconductor layer 21P, the active region 22P, and the P-type semiconductor layer 23P are stacked sequentially. The extended stacking layer 20P further comprises at least a N-type bare portion 24P, wherein the N-type bare portion 24P is extended from the P-type semiconductor layer 23P to the N-type semiconductor layer 21P via the active region 22P, so as to reveal and expose part of the surface of the N-type semiconductor layer 21P. The reflective layer 30P is stacked on the P-type semiconductor layer 23P. The barrier layer 40P is stacked on the P-type semiconductor layer 23P through covering the reflective layer 30P. The N-ohm contact layer 50P is stacked on the N-type semiconductor layer 21P through being held and kept on the N-type bare portion 24P. The first insulating layer 60P is stacked on the extended stacking layer 20P, the barrier layer 40P and the N-ohm contact layer 50P. The first insulating layer 60P has at least a first channel 61P and at least a second channel 62P. The first channel 61P of the first insulating layer 60P is extended to the N-ohm contact layer 50P, while the second channel 62P of the first insulating layer 60P is extended to the barrier layer 40P. The extended electrode layer 70P comprises at least a first extended electrode portion 71P and at least a second extended electrode portion 72P. The first extended electrode portion 71P is stacked on the first insulating layer 60P. The first extended electrode portion 71P is extended and electrically connected to the N-ohm contact layer via the first channel 61P of the first insulating layer 60P. The second extended electrode portion 72P is stacked on the first insulating layer 60P. The second extended electrode portion 72P is extended and electrically connected to the barrier layer 40P through the second channel 62P of the first insulating layer 60P. The second insulating layer 80P is stacked on the first extended electrode portion 71P and the second extended electrode portion 72P and the second insulating layer 80P is filled in the gap that forms between the first extended electrode portion 71P and the second extended electrode portion 72P. The second insulating layer 80P has at least a third channel 81P and at least a fourth channel 82P, wherein the third channel 81P of the second insulating layer 80P is extended to the first extended electrode portion 71P, wherein the fourth channel 82P of the second insulating layer 80P is extended to the second extended electrode portion 72P. The electrode set 90P comprises an N-type electrode 91P and a P-type electrode 92P, wherein the N-type electrode 91P is stacked on the second insulating layer 80P and the N-type electrode 91P is extended and electrically connected to the first extended electrode portion 71P through the third channel 81P of the second insulating layer 80P. The P-type electrode 92P is extended and electrically connected to the second extended electrode portion 72P through the fourth channel 82P of the second insulating layer 80P.

The manufacturing steps of the flip chip as illustrated in FIG. 1 are relatively complex, which include nine photoetching processes: Mesa process, De process, Mirror process, Barrier process, N-contact electrode process, first insulating layer process, extended electrode process, second insulating layer process, and electrode process. This renders high production costs and lower production efficiency of the flip chip. Nevertheless, during the manufacturing processes of the flip chip, the more of the photoetching processes the higher the risk that the stability and reliability of the flip chip can be affected.

SUMMARY OF THE PRESENT INVENTION

An object of the present invention is to provide a flip light emitting chip and manufacturing method thereof, wherein the manufacturing processes of the flip light emitting chip can be simplified, so as to benefit the production efficiency of the flip light emitting chip and reduce the production cost the flip light emitting chip.

An object of the present invention is to provide a flip light emitting chip and manufacturing method thereof, wherein the manufacturing processes of the flip light emitting chip can be simplified, so as to benefit the product yield rate of the flip light emitting chip and ensure the reliability of the flip light emitting chip.

An object of the present invention is to provide a flip light emitting chip and manufacturing method thereof, wherein the flip light emitting chip provides a barrier layer and a first insulating layer, wherein the binding force between the barrier layer and the first insulating layer can be greatly increased so as to enhance the reliability of the flip light emitting chip.

An object of the present invention is to provide a flip light emitting chip and manufacturing method thereof, wherein the flip light emitting chip provides a bonding layer formed between the barrier layer and the first insulating layer to enhance the binding force between the barrier layer and the first binding force through the bonding layer.

An object of the present invention is to provide a flip light emitting chip and manufacturing method thereof, wherein the flip light emitting chip provides a blockage layer formed between the barrier layer and the bonding layer to enhance the controllability of the manufacturing process of the flip light emitting chip.

An object of the present invention is to provide a flip light emitting chip and manufacturing method thereof, wherein the blockage layer has a great etching resistance property, such that the blockage layer formed between the barrier layer and the bonding layer can enhance the controllability of the manufacturing process of the flip light emitting chip.

An object of the present invention is to provide a flip light emitting chip and manufacturing method thereof, wherein the flip light emitting chip provides an extended stacking layer and an extended electrode layer, wherein a first extended electrode portion of the extended electrode layer directly contacts an N-type semiconductor layer of the extended stacking layer, such that the first extended electrode portion is able to not only function as an extended electrode, but also serve for contacting, such that the flip light emitting chip does not require having an N-type ohm contact layer. Accordingly, the manufacturing process of the flip light emitting chip is simplified.

An object of the present invention is to provide a flip light emitting chip and manufacturing method thereof, wherein the flip light emitting chip provides a first insulating material base layer, which is formed on the extended stacking layer, wherein during the manufacturing process of the flip light emitting chip, the first insulating material base layer is segmentally etched to form and provide a first channel at the first insulating material base layer, so as to ensure a portion of the surface of the N-type semiconductor layer be exposed in the first channel, such that the reliability of the electric connection between the first extended electrode portion and the N-type semiconductor layer can be ensured.

An object of the present invention is to provide a flip light emitting chip and manufacturing method thereof, wherein during the process of manufacturing the flip light emitting chip, the first insulating material base layer is firstly etched, and then the interface layer formed on the N-type semiconductor layer during the etching process of the first insulating material base layer will be etched, such that a portion of the surface of the N-type semiconductor layer can be exposed at the first channel, so as to ensure the reliability of the electric connection between the first extended electrode portion and the N-type semiconductor layer.

An object of the present invention is to provide a flip light emitting chip and manufacturing method thereof, wherein during the manufacturing process of the flip light emitting chip, the first insulating material base layer is segmentally etched to form and provide a second channel in the first insulating material base layer, so as to ensure a portion of the surface of the barrier layer of the flip light emitting chip be exposed in the second channel, such that the reliability of the electric connection between the second extended electrode portion of the extended electrode layer and the barrier layer can be ensured.

An object of the present invention is to provide a flip light emitting chip and manufacturing method thereof, wherein during the process of manufacturing the flip light emitting chip, the first insulating material base layer is firstly etched, and then the interface layer formed on the barrier layer during the etching process of the first insulating material base layer will be etched, such that a portion of the surface of the barrier layer can be exposed in the second channel, so as to ensure the reliability of the electric connection between the second extended electrode portion and the barrier layer.

An object of the present invention is to provide a flip light emitting chip and manufacturing method thereof, wherein the flip light emitting chip provides a reflective layer, which is stacked on a P-type semiconductor layer of the extended stacking layer, wherein the reflective layer is a multi-layer stacking structure, such that the reliability of the flip light emitting chip can be ensured.

An object of the present invention is to provide a flip light emitting chip and manufacturing method thereof, wherein the barrier layer is stacked on the P-type semiconductor layer through covering, enclosing and wrapping up the reflective layer, wherein the barrier layer is a multi-layer stacking structure, such that the barrier layer can effectively prevent diffusion and migration of the reflective layer, so as to ensure the reliability of the flip light emitting chip.

According to an aspect of the present invention, the present invention provides a flip light emitting chip, comprising:

a substrate;

an extended stacking layer, which comprises an N-type semiconductor layer, an active region and a P-type semiconductor layer, wherein the substrate, the N-type semiconductor layer, the active region, and the P-type semiconductor layer are formed sequentially;

a reflective layer formed on the P-type semiconductor layer;

a barrier layer formed on the P-type semiconductor layer through covering the reflective layer;

a bonding layer formed on the barrier layer;

a first insulating layer formed on the bonding layer, wherein the first insulating layer has at least a first channel extended to the N-type semiconductor layer and at least a second channel extended to the barrier layer;

an extended electrode layer, which comprises a first extended electrode portion and a second extended electrode portion, wherein the first extended electrode portion has at least a first extended electrode pin provided in such a manner that when the first extended electrode portion is formed on the first insulating layer, the first extended electrode pin is formed in the first channel and electrically connected with the N-type semiconductor layer, wherein the second extended electrode portion has at least a second extended electrode pin provided in such a manner that when the second extended electrode portion is formed on the first insulating layer, the second extended electrode pin is formed in the second channel and electrically connected with the barrier layer; and an electrode set, which comprises an N-type electrode and a P-type electrode, wherein the N-type electrode is electrically connected with the first extended electrode portion and the P-type electrode is electrically connected with the second extended electrode portion.

According to one embodiment of the present invention, the flip light emitting chip further comprises a blockage layer, formed on the barrier layer, wherein the bonding layer is formed on the blockage layer.

According to one embodiment of the present invention, the material of the bonding layer is titanium (Ti) or chromium (Cr).

According to one embodiment of the present invention, the material of the blockage layer is selected from the group consisting of nickel (Ni), platinum (Pt), zirconium (Zr), and combinations thereof.

According to one embodiment of the present invention, the extended stacking layer has at least a semiconductor bare portion, extended from the P-type semiconductor layer to the N-type semiconductor layer via the active region, wherein the barrier layer has at least a barrier layer perforation, wherein the semiconductor bare portion of the extended stacking layer and the barrier layer perforation of the barrier layer are communicated and connected, wherein the first insulating layer is extended to the N-type semiconductor layer via the barrier layer perforation of the barrier layer and the semiconductor bare portion of the extended stacking layer.

According to one embodiment of the present invention, the reflective layer has at least a reflective layer perforation, wherein the semiconductor bare portion of the extended stacking layer is arranged corresponding to the reflective layer perforation of the reflective layer, wherein a size of the semiconductor bare portion of the extended stacking layer is smaller than a size of the reflective layer perforation, such that a portion of the surface of the P-type semiconductor layer is exposed in the reflective layer perforation, so as to allow the barrier layer being formed on the surface of the P-type semiconductor layer that is revealed in the reflective layer perforation.

According to one embodiment of the present invention, the length and width of the reflective layer is smaller than the length and width of the P-type semiconductor layer, so as to expose a periphery of the P-type semiconductor layer and allow the barrier layer to be formed on the exposed periphery of the P-type semiconductor layer.

According to one embodiment of the present invention, the extended stacking layer has at least a substrate bare portion extended from the P-type semiconductor layer to the substrate via the active region and the N-type semiconductor layer, wherein the first insulating layer is formed on the substrate through being retained on the substrate bare portion.

According to one embodiment of the present invention, the substrate bare portion is arranged to surround the extended stacking layer.

According to one embodiment of the present invention, the reflective layer is a reflective layer with a multiple stacking structure.

According to one embodiment of the present invention, the reflective layer comprises a first reflective metallic material layer and a second reflective metallic material layer, wherein the first reflective metallic material layer is formed on the P-type semiconductor layer, wherein the second reflective metallic material layer is formed on the first reflective metallic material layer, wherein the material of the first reflective metallic material layer is selected from the group consisting of aluminum (Al), silver (Ag), platinum (Pt), gold (Au), and combinations thereof, wherein the material of the second reflective metallic material layer is selected from the group consisting of platinum (Pt), titanium (Ti), wolfram (W), nickel (Ni), and combinations thereof.

According to one embodiment of the present invention, the barrier layer is a barrier layer with a multiple stacking structure.

According to one embodiment of the present invention, the barrier layer comprises a first barrier metallic material layer and a second barrier metallic material layer, wherein the first barrier metallic material layer is formed on the P-type semiconductor layer through covering the reflective layer, wherein the second barrier metallic material layer is formed on the first barrier metallic material layer, wherein the material of the first barrier metallic material layer is selected from the group consisting of nickel (Ni), titanium (Ti), chromium (Cr), and combinations thereof, wherein the material of the second barrier metallic material layer is selected from the group consisting of platinum (Pt), titanium (Ti), wolfram (W), nickel (Ni), and combinations thereof.

According to one embodiment of the present invention, a thickness of the reflective layer is between 100 nm to 1000 nm.

According to one embodiment of the present invention, a minimum thickness of the barrier layer is between 0.1 μm to 3 μm.

According to one embodiment of the present invention, the flip light emitting chip further comprises a second insulating layer, formed on the first extended electrode portion, the second extended electrode portion and the first insulating layer, wherein the second insulating layer has at least a third channel and at least a fourth channel, wherein the third channel is extended to the first extended electrode portion and the fourth channel is extended to the second extended electrode portion, wherein the N-type electrode has at least a N-type electrode connecting pin formed and provided in the third channel and electrically connected with the first extended electrode portion when the N-type electrode is formed on the second insulating layer, wherein the P-type electrode has at least a P-type electrode connecting pin formed and provided in the fourth channel and electrically connected with the second extended electrode portion when the P-type electrode is formed on the second insulating layer.

According to another aspect of the present invention, the present invention further provides a manufacturing method of flip light emitting chip, comprising the following steps:

(a) forming an extended stacking layer on a substrate;

(b) forming a reflective layer on a P-type semiconductor layer of the extended stacking layer;

(c) forming a barrier layer on the P-type semiconductor layer through covering the reflective layer;

(d) forming a bonding layer on the barrier layer;

(e) forming a first insulating layer on the bonding layer, wherein the first insulating layer has at least a first channel and at least a second channel, wherein the first channel is extended to an N-type semiconductor layer of the extended stacking layer and the second channel is extended to the barrier layer;

(f) forming a first extended electrode pin of the first extended electrode portion in the first channel of the first insulating layer to electrically connect with the N-type semiconductor layer when forming a first extended electrode portion on the first insulating layer where the first extended electrode pin is, and, correspondingly, forming a second extended electrode pin of the second extended electrode portion in the second channel of the first insulating layer to electrically connect with the barrier layer when forming a second extended electrode portion on the first insulating layer; and (g) respectively electrically connecting an N-type electrode with the first extended electrode portion and electrically connecting a P-type electrode with the second extended electrode portion, so as to produce the flip light emitting chip.

According to one embodiment of the present invention, before the step (d), the manufacturing method further comprises a step of forming a blockage layer on the barrier layer, so as for forming the bonding layer on the blockage layer in the step (d).

According to one embodiment of the present invention, the step (e) further comprising the following steps:

(e.1) forming a first insulating material base layer on the bonding layer; and (e.2) etching the first insulating material base layer to form the first insulating layer having the first channel and the second channel.

According to one embodiment of the present invention, in the step (e.2), the first insulating material base layer is segmentally etched to form the first channel.

According to one embodiment of the present invention, in the step (e.2), the first insulating material base layer is segmentally etched to form the second channel.

According to one embodiment of the present invention, in the manufacturing method, the first insulating material base layer is etched and then the interface layer, which is formed on the N-type semiconductor layer when the first insulating material base layer is etched, is etched so as to form the first channel that is extended to the N-type semiconductor layer.

According to one embodiment of the present invention, in the manufacturing method, the first insulating material base layer is etched and then the interface layer, which is formed on the barrier layer when the first insulating material base layer is etched, is etched so as to form the second channel that is extended to the barrier layer.

According to one embodiment of the present invention, in the manufacturing method, the first insulating material base layer is first etched with a gaseous mixture of argon (Ar), trifluoromethane ($CHF_3$), and oxygen ($O_2$), and the interface layer is etched with a gaseous mixture of two or three of argon (Ar), chlorine ($Cl_2$), and boron trichloride ($BCl_3$).

According to one embodiment of the present invention, in the step (a), the P-type semiconductor layer formed by etching the extended stacking layer is extended from the extended stacking layer to at least a semiconductor bare portion of the N-type semiconductor layer via an active region, wherein in the step (c), providing a barrier layer perforation on the barrier layer for connecting and communicating with the semiconductor bare portion, so as to allow the first insulating layer being extended to the N-type semiconductor layer via the barrier layer perforation and the semiconductor bare portion in the step (e).

According to an embodiment of the present invention, in the step (a), the extended stacking layer is etched to form a substrate bare portion extended from the P-type semiconductor layer of the extended stacking layer to the substrate via the active region and the N-type semiconductor layer, so as to allow the first insulating layer being formed on the substrate through being held on the substrate bare portion in the step (e).

According to one embodiment of the present invention, in the step (a), the extended stacking layer is etched along a periphery edge thereof, so as to allow the first insulating layer to cover the periphery edge of the extended stacking layer through being formed on the substrate in the step (e).

According to one embodiment of the present invention, in the step (b), a portion of the surface of the P-type semiconductor layer is exposed in a reflective layer perforation of the reflective layer and a periphery of the P-type semiconductor layer is exposed around a periphery of the reflective layer, such that, in the step (c), the barrier layer is formed at the portion of the surface of the P-type semiconductor layer which is exposed in the reflective layer perforation and the periphery of the P-type semiconductor layer to cover the reflective layer.

According to one embodiment of the present invention, before the step (g), the manufacturing method further comprises the following steps: forming a second insulating layer, which has at least a third channel and at least a fourth channel, on the first extended electrode portion, the second extended electrode portion and the first insulating layer, wherein the third channel is extended to the first extended electrode portion and the fourth channel is extended to the second extended electrode portion, such that, in the step (g), when an N-type electrode connecting pin of the N-type electrode is formed on the second insulation layer, a N-type electrode connecting pin of the N-type electrode is formed in the third channel and electrically connected with the first extended electrode portion, and, correspondingly, when the P-type electrode is formed on the second insulating layer, a P-type electrode connecting pin of the P-type electrode is formed in the fourth channel and electrically connected with the second extended electrode portion.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The following description is disclosed to enable any person skilled in the art to make and use the present invention. Preferred embodiments in the following are examples only and person skilled in the art can come out with other obvious alternatives. The general principles defined in the following description would be applied to other embodiments, alternatives, modifications, equivalents, and applications without departing from the spirit and scope of the present invention.

Those skilled in the art should understand that in the disclosure of the present invention, terms such as "longitudinal," "lateral," "upper," "lower," "front," "back," "left," "right," "perpendicular," "horizontal," "top," "bottom," "inner," "outer," etc., which indicate directions or positional relations are based on the directions or positional relations demonstrated in the figures and only to better describe the present invention and simplify the description, rather than to indicate or imply that the indicated device or element must be applied to a specific direction or be operated or constructed in a specific direction. Therefore, these terms shall not be considered limits of the present invention.

It is understandable that terminologies of "a" or "an" should be interpreted as "at least one" or "one or more." In other words, in one embodiment, the quantity of an element can be one, but in another embodiment, the quantity of the element can be several. Hence, the terminologies of "a" or "an" shall not be considered as a limit of quantity.

Figure 12A:
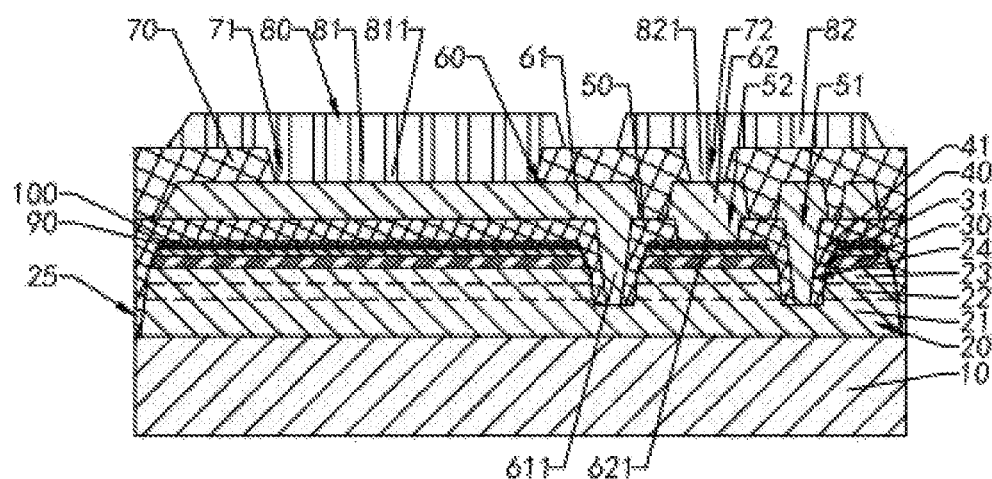
FIG. 12A is a sectional view illustrating the eleventh step of the manufacturing process of the flip light emitting chip of according to the above preferred embodiment of the present invention, which reveals the top view of the flip light emitting chip.
Figure 12B:
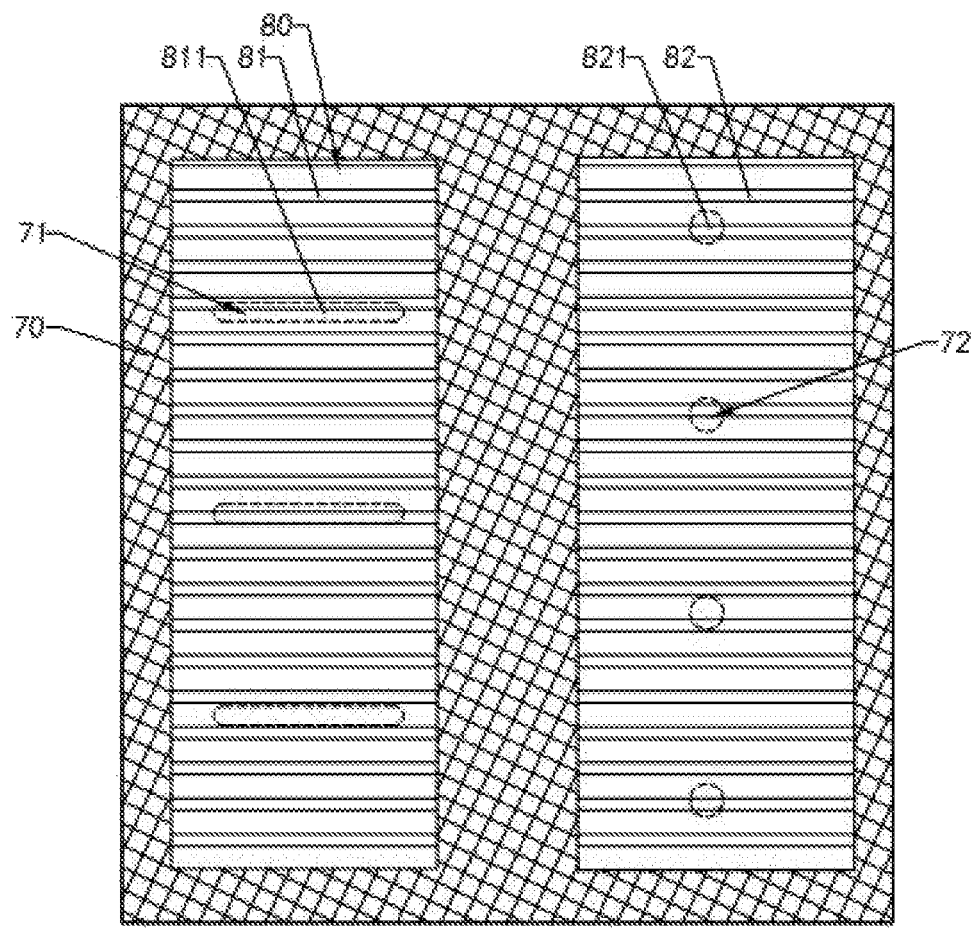
FIG. 12B is a top view illustrating the eleventh step of the manufacturing process of the flip light emitting chip of according to the above preferred embodiment of the present invention, which reveals the sectional view of the flip light emitting chip.

Referring to FIGS. 12A to 12B of the present invention, a flip light emitting chip according to a preferred embodiment of the present invention is illustrated and disclosed, the flip light emitting chip comprises a substrate 10, an extended stacking layer 20, a reflective layer 30, a barrier layer 40, a blockage layer 90, a bonding layer 100, a first insulating layer 50, an extended electrode layer 60, a second insulating layer 70, and an electrode set 80.

FIGS. 2 to 12B further illustrate the steps of a manufacture process of the flip light emitting chip. In the following description, the relationship among the substrate 10, the extended stacking layer 20, the reflective layer 30, the barrier layer 40, the blockage layer 90, the bonding layer 100, the first insulating layer 50, the extended electrode layer 60, the second insulating layer 70, and the electrode set 80 of the flip light emitting chip is described and disclosed along with the description and disclosure of the manufacturing process of the flip light emitting chip.

Figure 1:
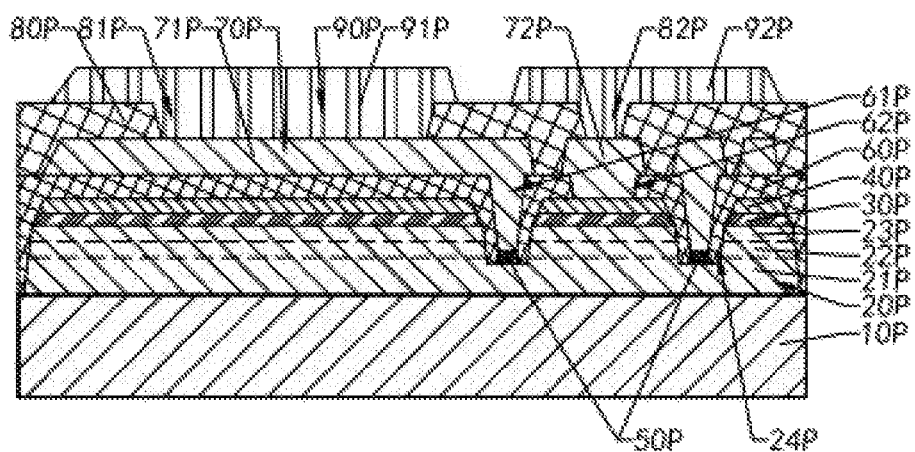
FIG. 1 is a sectional view of a conventional flip chip.
Figure 2:
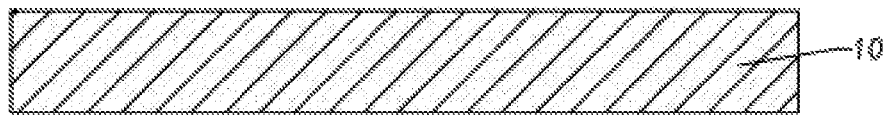
FIG. 2 is a sectional view illustrating the first step of a manufacturing process of a flip light emitting chip of according to a preferred embodiment of the present invention.

Referring to FIG. 2, a sectional view of the substrate 10 is illustrated. Forms and types of the substrate 10 shall not be limited for the flip light emitting chip of the present invention. For instance, the substrate 10 can be, but not limited to, aluminum oxide (Al2O3) substrate, silicon carbide (SiC) substrate, silicon (Si) substrate, gallium nitride (GaN) substrate, gallium arsenide (GaAs) substrate, and gallium phosphide (GaP) substrate.

Figure 3:
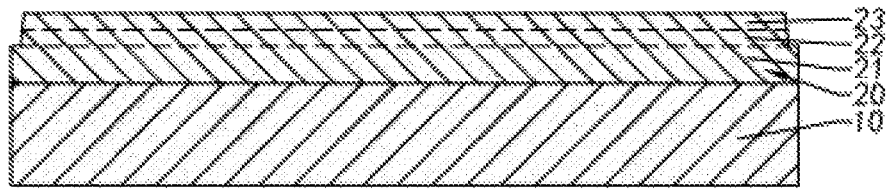
FIG. 3 is a sectional view illustrating the second step of the manufacturing process of the flip light emitting chip of according to the above preferred embodiment of the present invention.

Referring to FIG. 3, the extended stacking layer 20 further comprises an N-type semiconductor layer 21, an active region 22 and a P-type semiconductor layer 23. The N-type semiconductor layer 21 is grown from the substrate 10 to form the N-type semiconductor layer 21 stacked on the substrate 10. The active region 22 is grown from the N-type semiconductor layer 21 to form the active region 22 stacked on the N-type semiconductor layer 21. The P-type semiconductor layer 23 is grown from the active region 22 to form the P-type semiconductor layer 23 stacked on the active region 22.

It is worth mentioning that the manners of stacking the extended stacking layer 20 on the substrate 10 is not limited in the flip light emitting chip of the present invention. For example, the flip light emitting chip according to the preferred embodiment as illustrated in FIGS. 12A and 12B can utilize a Metal-organic Chemical Vapor Deposition (MOCVD) to grow the N-type semiconductor layer 21 from the substrate 10, to grow the active region 22 from the N-type semiconductor layer 21, and to grow the P-type semiconductor layer 23 from the active region 22, so as to form the extended stacking layer 20 stacked on the substrate 10.

It is worth mentioning that, according to the present invention, the "stacking" may refer to direct stacking or indirect stacking. For instance, according to the preferred embodiment of the flip light emitting chip of the present invention, the N-type semiconductor layer 21 of the extended stacking layer 20 may directly be formed and stacked on the substrate 10. In other words, the N-type semiconductor layer 21 of the extended stacking layer 20 is directly grown from the substrate 10. Nonetheless, for the flip light emitting chip according to another preferred embodiment of the present invention, the N-type semiconductor layer 21 of the extended stacking layer 20 may be indirectly formed and stacked on the substrate 10 that, for example, a buffer layer may be formed and provided between the substrate 10 and the N-type semiconductor layer 21 of the extended stacking layer 20. That is the buffer layer is firstly grown from the substrate 10, and then the N-type semiconductor layer 21 is grown from and on the buffer layer, so as to form the N-type semiconductor layer 21 indirectly stacked on the substrate 10.

Figure 4A:
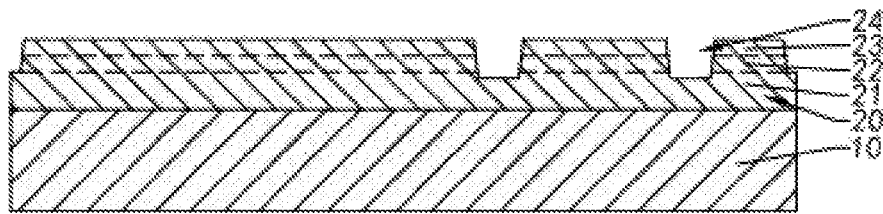
FIG. 4A is a sectional view illustrating the third step of the manufacturing process of the flip light emitting chip of according to the above preferred embodiment of the present invention.
Figure 4B:
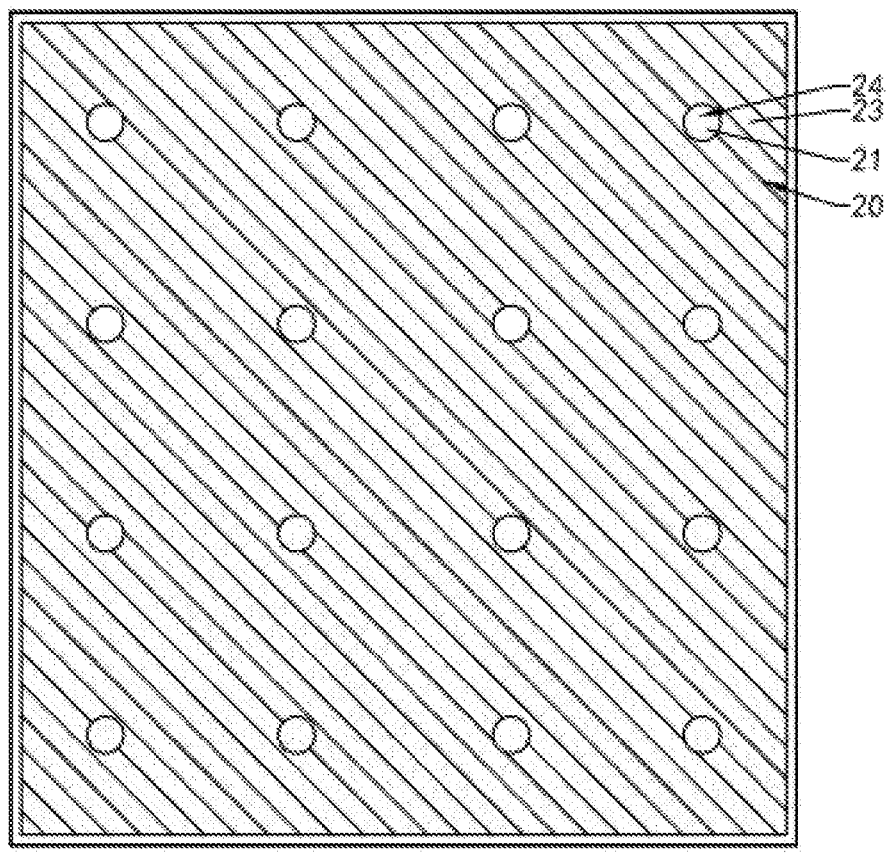
FIG. 4B is a top view illustrating the third step of the manufacturing process of the flip light emitting chip of according to the above preferred embodiment of the present invention.

Referring to FIGS. 4A to 4B, the extended stacking layer 20 further has at least a semiconductor bare portion 24, wherein the semiconductor bare portion 24 is extended from the P-type semiconductor layer 23 to the N-type semiconductor layer 21 via the active region 22, so that a portion of the surface of the N-type semiconductor layer 21 is exposed at the semiconductor bare portion 24.

Preferably, after the extended stacking layer 20 is formed and stacked on the substrate 10, the semiconductor bare portion 24 can be formed through etching the extended stacking layer 20. Specifically speaking, an Inductively Coupled Plasma (ICP) is able to be used for sequentially dry etching the P-type semiconductor layer 23 and the active region 22 of the extended stacking layer 20, so as to form the semiconductor bare portion 24 that is extended from the P-type semiconductor layer 23 to the N-type semiconductor layer 21 via the active region 22.

Regarding to the flip light emitting chip according to the preferred embodiment as illustrated in FIGS. 12A-12B, a portion of the N-type semiconductor layer 21 is etched such that the semiconductor bare portion 24 is extended from the P-type semiconductor layer 23 to a middle portion of the N-type semiconductor layer 21 via the active region 22, wherein a thickness of the N-type semiconductor layer 21 in correspondence to the semiconductor bare portion 24 is smaller than a thickness of the rest portions of the N-type semiconductor layer 21.

Figure 5A:
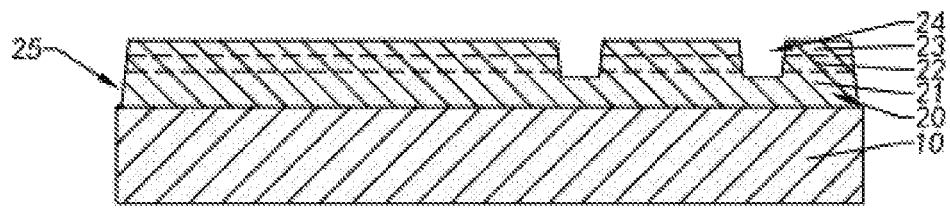
FIG. 5A is a sectional view illustrating the fourth step of the manufacturing process of the flip light emitting chip of according to the above preferred embodiment of the present invention.
Figure 5B:
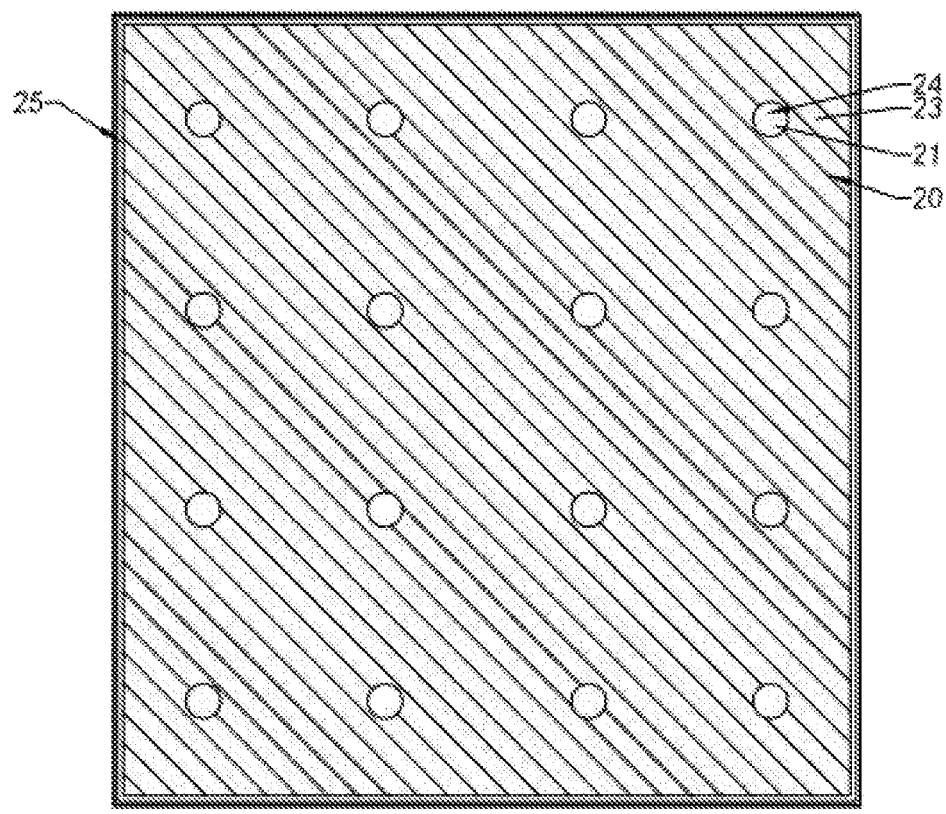
FIG. 5B is a top view illustrating the fourth step of the manufacturing process of the flip light emitting chip of according to the above preferred embodiment of the present invention.

Preferably, referring to FIGS. 5A to 5B, the extended stacking layer 20 further has a substrate bare portion 25. Around a periphery edge of the extended stacking layer 20, the substrate bare portion 25 is formed and extended from the P-type semiconductor layer 23 to the substrate 10 via the active region 22 and the N-type semiconductor layer 21, so as to expose the periphery edge of the substrate 10. Preferably, the substrate bare portion 25 is arranged surrounding the periphery edge of the extended stacking layer 20, so as to have the periphery edge of the substrate 10 be revealed and exposed at the substrate bare portion 25.

Regarding to the flip light emitting chip according to the preferred embodiment of the present invention, the middle portion of the extended stacking layer 20 may be firstly etched to form the semiconductor bare portion 24, and then the periphery edge of the extended stacking layer 20 is etched to form and provide the substrate bare portion 25. Regarding to the flip light emitting chip according to another preferred embodiment of the present invention, the periphery edge of the extended stacking layer 20 may be firstly etched to form and provide the substrate bare portion 25, and then the middle portion of the extended stacking layer 20 is etched to form and provide the semiconductor bare portion 24. Preferably, the semiconductor bare portion 24 and the substrate bare portion 25 of the extended stacking layer 20 can be formed by etching the middle portion and the periphery edge of the extended stacking layer 20 at the same time.

It is worth mentioning that, although the semiconductor bare portion 24 of the extended stacking layer 20 is formed on the middle portion of the extended stacking layer 20 for the flip light emitting chip according to this preferred embodiment as illustrated in FIGS. 2 to 12B, the semiconductor bare portion 24 may also be formed at the periphery of the extended stacking layer 20 for the flip light emitting chip according to other embodiment of the present invention. In other words, the specific position of the semiconductor bare portion 24 of the flip light emitting chip shall not be limited in the present invention.

Figure 6A:
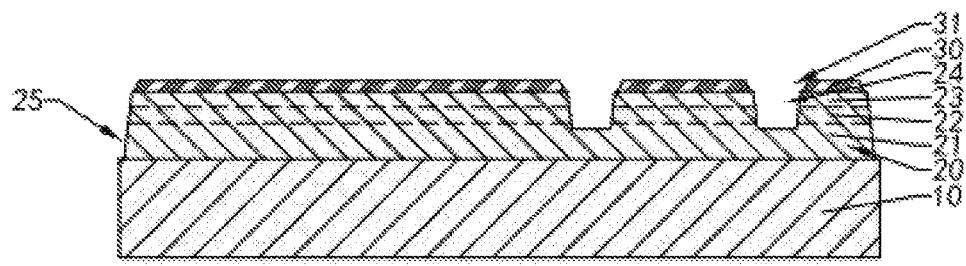
FIG. 6A is a sectional view illustrating the fifth step of the manufacturing process of the flip light emitting chip of according to the above preferred embodiment of the present invention.
Figure 6B:
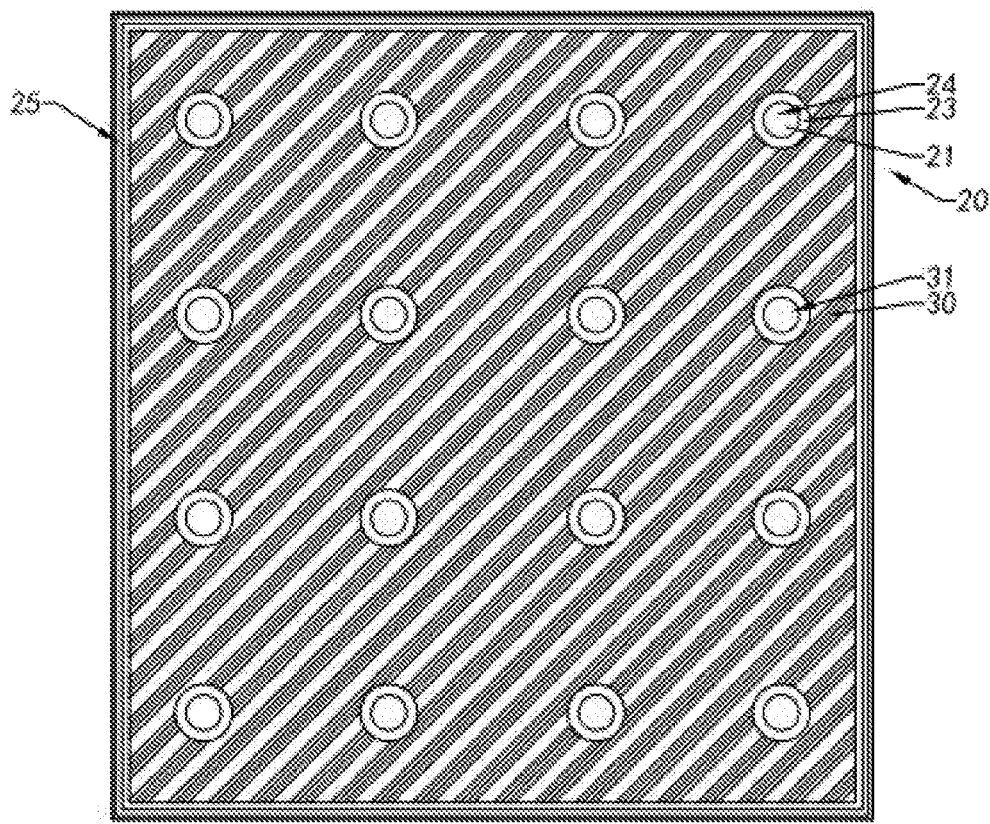
FIG. 6B is a top view illustrating the fifth step of the manufacturing process of the flip light emitting chip of according to the above preferred embodiment of the present invention.

Referring to FIGS. 6A to 6B, the reflective layer 30 is grown from the P-type semiconductor layer 23 of the extended stacking layer 20, so as to form the reflective layer 30 stacked on the P-type semiconductor layer 23 of the extended stacking layer 20. The reflective layer 30 has at least a reflective layer perforation 31 formed and provided at a position corresponding to the semiconductor bare portion 24 of the extended stacking layer 20, such that the semiconductor bare portion 24 of the extended stacking layer 20 is aligned and communicated with the reflective layer perforation 31 of the reflective layer 30. Preferably, a shape of the reflective layer perforation 31 of the reflective layer 30 and a shape of the semiconductor bare portion 24 of the extended stacking layer 20 are the same and a size of the reflective layer perforation 31 of the reflective layer 30 is greater than a size of the semiconductor bare portion 24 of the extended stacking layer 20. Accordingly, after the reflective layer 30 is formed and stacked on the P-type semiconductor layer 23 of the extended stacking layer 20, a portion of the surface of the P-type semiconductor layer 23 is exposed in the reflective layer perforation 31 of the reflective layer 30.

It is worth mentioning that even though both the semiconductor bare portion 24 of the extended stacking layer 20 and the reflective layer perforation 31 of the reflective layer 30 of the flip light emitting chip according to the preferred embodiment are in circular shape as illustrated in FIGS. 5A to 6B, person skill in the art should be able to understand that the shapes of the semiconductor bare portion 24 of the extended stacking layer 20 and the reflective layer perforation 31 of the reflective layer 30 as illustrated in FIGS. 5A to 6B are just an example for disclosing and illustrating the configuration and features of the flip light emitting chip of the present invention, which shall not be considered as limiting the configuration and scope of the flip light emitting chip of the present invention. For example, for the flip light emitting chip according to other embodiments of the present invention, the shapes of the semiconductor bare portion 24 of the extended stacking layer 20 and the reflective layer perforation 31 of the reflective layer 30 may be, but not limited to, oval or square.

Preferably, referring to FIGS. 6A and 6B, the length and width of the reflective layer 30 is smaller than the length and width of the P-type semiconductor layer 23 of the extended stacking layer 20, such that after the reflective layer 30 was formed and stacked on the P-type semiconductor layer 23 of the extended stacking layer 20, the periphery edge of the extended stacking layer 20 would not be covered by the reflective layer 30, so as to allow the barrier layer 40 to cover, enclose, and wrap up the reflective layer 30 later.

It is worth mentioning that, for the flip light emitting chip according to other embodiments of the present invention, the length and width of the reflective layer 30 and the length and width of the P-type semiconductor layer 23 of the extended stacking layer 20 may be the same. Thereafter, the barrier layer 40 can also cover, enclose, and wrap up the reflective layer 30 through growing from the substrate 10.

Further, the reflective layer 30 is a multilayer stacking structure, which comprises a first reflective metallic material layer and a second reflective metallic material layer. The first reflective metallic material layer of the reflective layer 30 grown from the P-type semiconductor layer 23 of the extended stacking layer 20. The first reflective metallic material layer is formed of material selected from the group consisting of aluminum (Al), silver (Ag), platinum (Pt), gold (Au), and combinations thereof, so as to have great reflecting characteristic. The second reflective metallic material layer of the reflective layer 30 is grown from the first reflective metallic material layer. The second reflective metallic material layer is formed of material selected from the group consisting of platinum (Pt), titanium (Ti), wolfram (W), nickel (Ni), and combinations thereof, so as to have great resisting characteristic, such that the second reflective metallic material layer may be formed and stacked on the first reflective metallic material layer to prevent undesirable tendency of diffusion and migration from occurring to the first reflective metallic material layer. This is particularly important for ensuring the stability of the reflective layer 30.

The thickness of the reflective layer 30 is between 100 nm to 1000 nm (including 100 nm and 1000 nm), so as to avoid the reflection performance from being affected because the reflective layer 30 is too thin, and prevent the reflective layer 30 from peeling off due to greater flaking stress because the reflective layer 30 is too thick. Preferably, the thickness of the reflective layer 30 is between 100 nm to 200 nm. Specifically, the thickness of the reflective layer 30 is 150 nm.

Figure 7A:
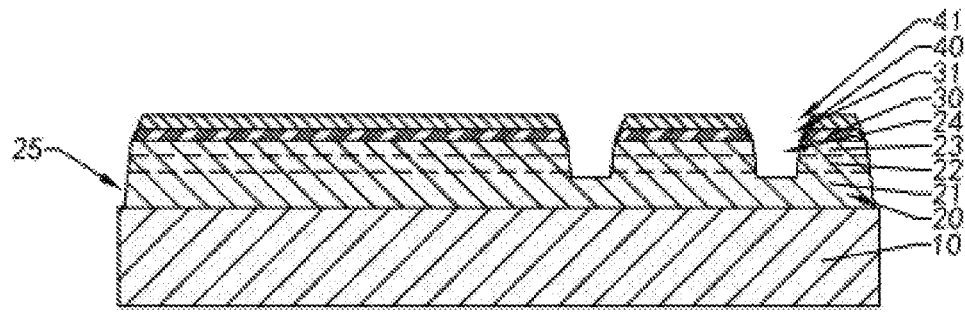
FIG. 7A is a sectional view illustrating the sixth step of the manufacturing process of the flip light emitting chip of according to the above preferred embodiment of the present invention.
Figure 7B:
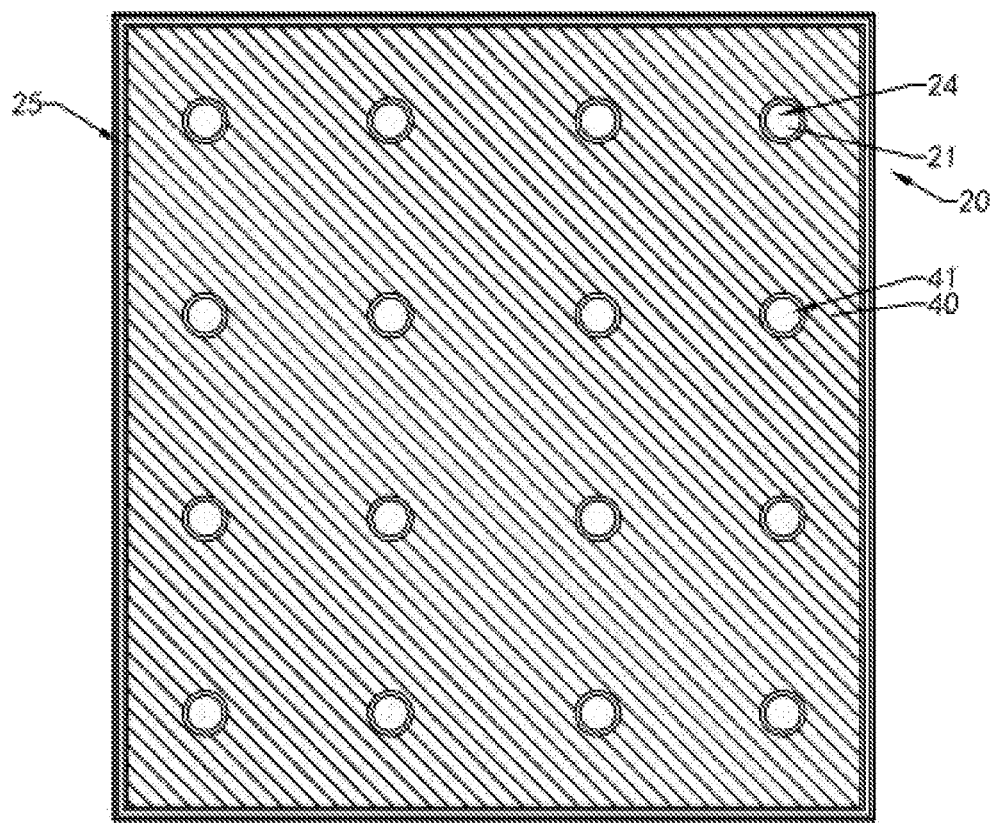
FIG. 7B is a top view illustrating the sixth step of the manufacturing process of the flip light emitting chip of according to the above preferred embodiment of the present invention.

Referring to FIGS. 7A and 7B, the barrier layer 40 is grown from the reflective layer 30 and the P-type semiconductor layer 23 of the extended stacking layer 20, so as to have the barrier layer 40 being formed and stacked on the extended stacking layer 20 and the P-type semiconductor layer 23 for covering, enclosing, and wrapping up the reflective layer 30. The barrier layer 40 is electrically connected with the P-type semiconductor layer 23 of the extended stacking layer 20. The barrier layer 40 has at least a barrier layer perforation 41 formed and provided at the position corresponding to the semiconductor bare portion 24 of the extended stacking layer 20, such that the semiconductor bare portion 24 of the extended stacking layer 20 is aligned and communicated with the barrier layer perforation 41 of the barrier layer 40. Preferably, the shape of the barrier layer perforation 41 of the barrier layer 40 and the shape of the semiconductor bare portion 24 of the extended stacking layer 20 are the same.

Because a size of the reflective layer perforation 31 of the reflective layer 30 is greater than a size of the semiconductor bare portion 24 of the extended stacking layer 20, such that a portion of the surface of the P-type semiconductor layer 23 of the extended stacking layer 20 is exposed through the reflective layer perforation 31 of the reflective layer 30, so as to allow the barrier layer 40 to be formed and stacked on the surface of the P-type semiconductor layer 23 of the extended stacking layer 20 that is exposed through the reflective layer perforation 31 of the reflective layer 30. In addition, because the dimensions of the length and width of the reflective layer 30 are smaller than the dimensions of the length and width of the P-type semiconductor layer 23 of the extended stacking layer 20, such that a periphery surface of the P-type semiconductor layer 23 of the extended stacking layer 20 is able to be exposed to the outside of the reflective layer 30, so as to allow the barrier layer 40 being formed and stacked on the surface of the periphery of the P-type semiconductor layer 23 of the extended stacking layer 20. Therefore, for the flip light emitting chip according to this preferred embodiment of the present invention, because the barrier layer 40 can be formed and stacked on the surface of the P-type semiconductor layer 23 of the extended stacking layer 20 that is exposed through the reflective layer perforation 31 of the reflective layer 30 as well as be formed and stacked on the periphery surface of the P-type semiconductor layer 23 of the extended stacking layer 20 that is exposed to the outside of the reflective layer 30. Hence, the barrier layer 40 can be formed and stacked on the P-type semiconductor layer 23 of the extended stacking layer 20 by covering, enclosing, and wrapping up the reflective layer 30.

Further, the barrier layer 40 is a multilayer stacking structure, which comprises a first barrier metallic material layer and a second barrier metallic material layer. The first barrier metallic material layer of the barrier layer 40 is formed and stacked on the P-type semiconductor layer 23 of the extended stacking layer 20 by covering, enclosing, and wrapping up the reflective layer 30. The first barrier metallic material layer is formed of material selected from the group consisting of nickel (Ni), titanium (Ti), chromium (Cr), and combinations thereof, so as to have great binding and attaching features. The second barrier metallic material layer of the barrier layer 40 is grown from the first barrier metallic material layer. The second barrier metallic material layer is formed of material selected from the group consisting of platinum (Pt), titanium (Ti), wolfram (W), nickel (Ni), and combinations thereof, so as to have great resisting ability to prevent undesirable tendency of diffusion or migration from occurring to the reflective layer 30. This is particularly important for ensuring the stability of the reflective layer 30.

In other words, the barrier layer 40 completely covers, encloses, and wraps up the reflective layer 20. The minimum thickness of the barrier layer 40 is between 0.1 μm and 3 μm (including 0.1 μm and 3 μm), so as to prevent failure of covering, enclosing, and wrapping up due to overly thin thickness of the barrier layer 40 and to prevent undesirable tendency of light absorption of the barrier layer 40 rendered by excessive thickness of the barrier layer 40. In addition, the thickness of the barrier layer 40 is thicker than the thickness of the reflective layer 20 for 3 μm-15 μm. Preferably, the thickness of the barrier layer 40 is thicker than the thickness of the reflective layer 20 for 5 μm-12 μm. Specifically, the thickness of the barrier layer 40 is thicker than the thickness of the reflective layer 20 for 8 μm.

It is worth mentioning that the minimum thickness of the barrier layer 40 is usually at the portion that the barrier layer 40 covers, enclose, and wraps up a sidewall of the reflective layer 30. The sidewall of the reflective layer 30 can be an inner wall of the reflective layer 30 that defines the reflective layer perforation 31 or an outer peripheral wall of the reflective layer 30.

Figure 8A:
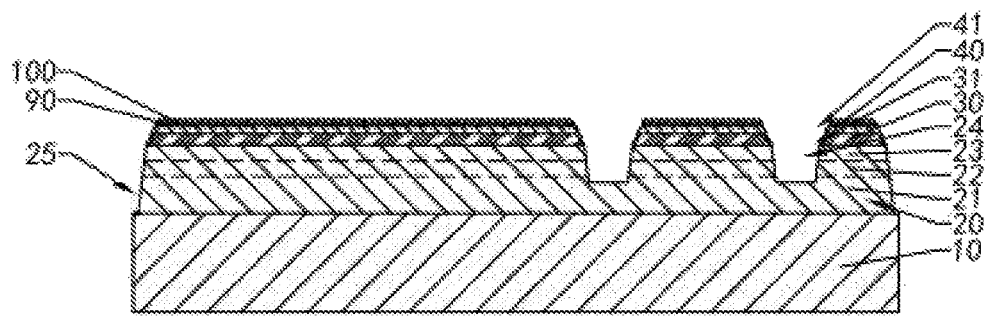
FIG. 8A is a sectional view illustrating the seventh step of the manufacturing process of the flip light emitting chip of according to the above preferred embodiment of the present invention.
Figure 8B:
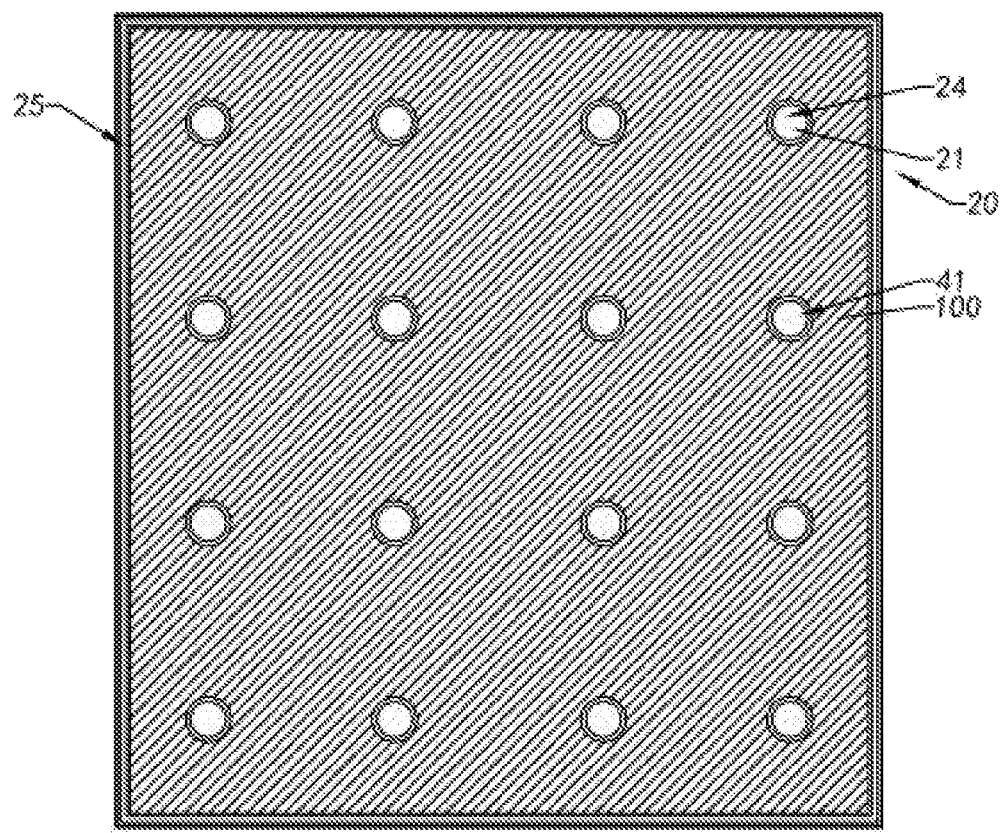
FIG. 8B is a top view illustrating the seventh step of the manufacturing process of the flip light emitting chip of according to the above preferred embodiment of the present invention.

Referring to FIGS. 8A and 8B, the blockage layer 90 is formed and stacked on the barrier layer 40. Regarding to the flip light emitting chip according to the preferred embodiment of the present invention, the blockage layer 90 is formed and stacked on an upper surface of the barrier layer 40 in order to cover, enclose and wrap up an upper surface of the barrier layer 40. Regarding to the flip light emitting chip according to another preferred embodiment of the present invention, the blockage layer 90 is formed and stacked on the upper and side surfaces of the barrier layer 40 so as to cover, enclose, and wrap up the barrier layer 40. Preferably, the blockage layer 90 is made of material selected from the group consisting of nickel (Ni), platinum (Pt), zirconium (Zr), and combinations thereof, so as to provide the blockage layer 90 a good anti-etching ability.

Further, referring to FIGS. 8A and 8B, the bonding layer 100 is formed and stacked on the blockage layer 90 so as to ensure the bonding layer 100 covering, enclosing, and wrapping up the surface and side of the blockage layer 900. Preferably, the material of the bonding layer 100 is titanium (Ti) or chromium (Cr), etc.

Figure 9A:
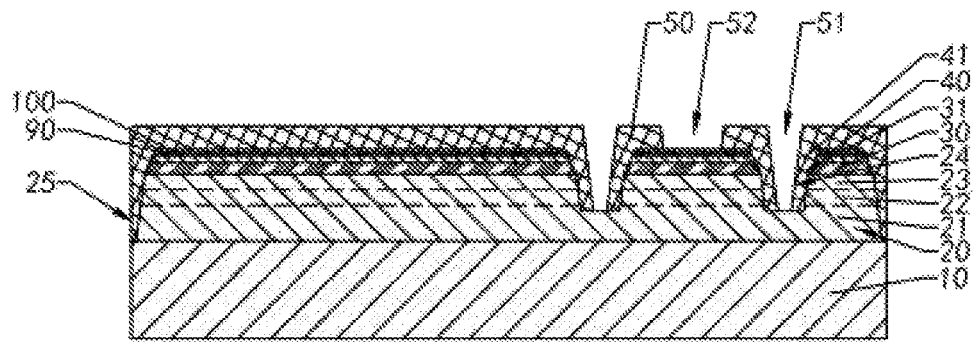
FIG. 9A is a sectional view illustrating the eighth step of the manufacturing process of the flip light emitting chip of according to the above preferred embodiment of the present invention.
Figure 9B:
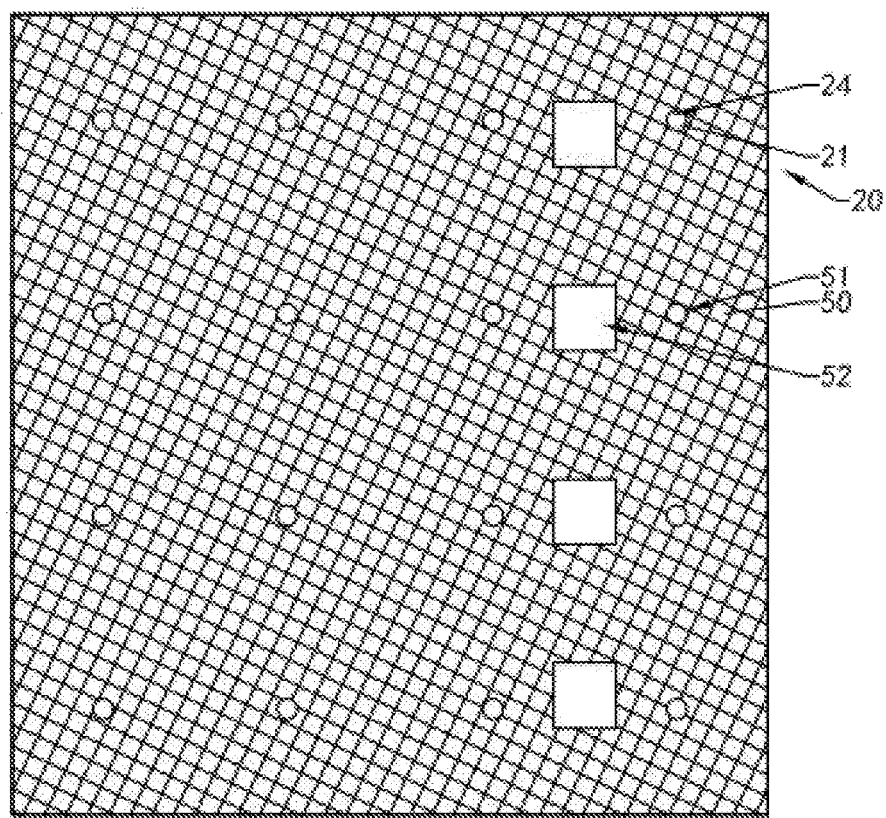
FIG. 9B is a top view illustrating the eighth step of the manufacturing process of the flip light emitting chip of according to the above preferred embodiment of the present invention.

Referring to FIGS. 9A and 9B, the first insulating layer 50 is formed and stacked on the bonding layer 100. The first insulating layer 50 is extended to the N-type semiconductor layer 21 of the extended stacking layer 20 via the barrier layer perforation 41 of the barrier layer 40 and the semiconductor bare portion 24 of the extended stacking layer 20. Preferably, the first insulating layer 50 is further extended to the substrate 10 via the substrate bare portion 25 of the extended stacking layer 20, so as to cover, enclose, and wrap up the extended stacking layer 20, the barrier layer 40 and the bonding layer 100 through the first insulating layer 50. Moreover, the bonding layer 100 is provided and retained between the barrier layer 40 and the first insulating layer 50. In this manner, the bonding layer 100 can enhance the binding force between the barrier layer 40 and the first insulating layer 50 that helps to ensure the reliability and stability of the flip light emitting chip.

The first insulating layer 50 has at least a first channel 51 and at least a second channel 52 provided therein in such a manner that the first channel 51 of the first insulating layer 50 is extended to the N-type semiconductor layer 21 of the extended stacking layer 20, so as to expose a portion of the surface of the N-type semiconductor layer 21 through the first channel 51. The second channel 52 of the first insulating layer 50 is extended to the barrier layer 40, so as to expose a portion of the surface of the barrier layer 40 through the second channel 52.

In particular, firstly, a first insulating material base layer is grown from the substrate 10, the N-type semiconductor layer 21 of the extended stacking layer 20, and the barrier layer 40. Preferably, the first insulating layer is formed of material selected from the group consisting of silicon dioxide ($SiO_2$), silicon nitride (SiN), titanium dioxide ($TiO_2$), tantalum pentoxide ($Ta_2O_5$), magnesium fluoride (MgF), and combinations thereof. Then, the first insulating material base layer is etched, so as to have the first insulating material base layer forming the first insulating layer 50 and forming the first channel 51 and the second channel 52 of the first insulating layer 50. In other words, the first insulating layer 50 is formed of a material selected from the group consisting of silicon dioxide ($SiO_2$), silicon nitride (SiN), titanium dioxide ($TiO_2$), tantalum pentoxide ($Ta_2O_5$), magnesium fluoride (MgF), and combinations thereof.

Preferably, for the flip light emitting chip according to the preferred embodiment of the present invention, the first insulating material base layer is segmentally etched to form the first channel 51 of the first insulating layer 50. Specifically, a gaseous mixture of argon (Ar), trifluoromethane ($CHF_3$), and oxygen ($O_2$) is firstly used to etch the first insulating material base layer. It is understandable that, when the gaseous mixture of argon, trifluoromethane, and oxygen contacts the N-type semiconductor layer 21 of the extended stacking layer 20 during the process of etching the first insulating material base layer, an interface layer is formed on the surface of the N-type semiconductor layer 21. And then, a gaseous mixture of any two or three of argon (Ar), trifluoromethane ($CHF_3$), and boron trichloride ($BCl_3$) is used to etch the interface layer to form the first channel 51. In this manner, portion of the surface of the N-type semiconductor layer 21 of the extended stacking layer 20 can be exposed through the first channel 51.

Correspondingly, the first insulating material base layer is segmentally etched to form the second channel 52 of the first insulating layer 50. Specifically, a gaseous mixture of argon (Ar), trifluoromethane ($CHF_3$), and oxygen ($O_2$) is used to etch the first insulating material base layer. It is understandable that, when the gaseous mixture of argon, trifluoromethane, and oxygen contacts the barrier layer 40 during the process of etching the first insulating material base layer, an interface layer is formed on the surface of the barrier layer 40. Then, a gaseous mixture of any two or three of argon (Ar), trifluoromethane ($CHF_3$), and boron trichloride ($BCl_3$) is used to etch the interface layer to form the second channel 52. In this manner, portion of the surface of the barrier layer 40 can be exposed through the second channel 52.

Figure 10A:
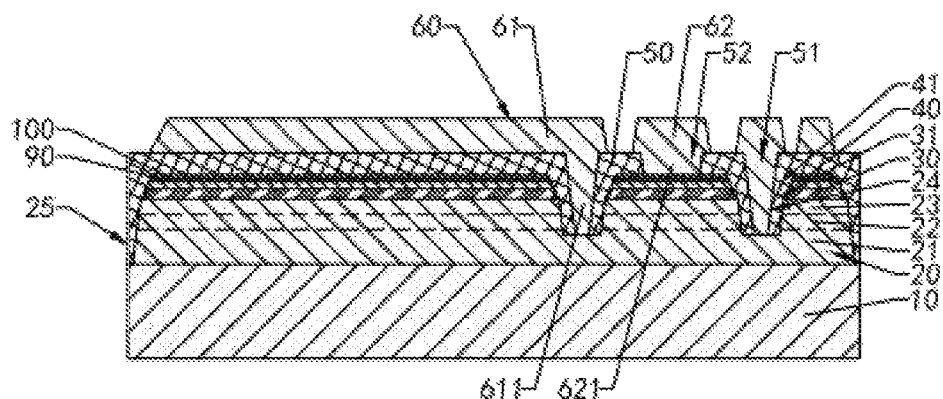
FIG. 10A is a sectional view illustrating the ninth step of the manufacturing process of the flip light emitting chip of according to the above preferred embodiment of the present invention.
Figure 10B:
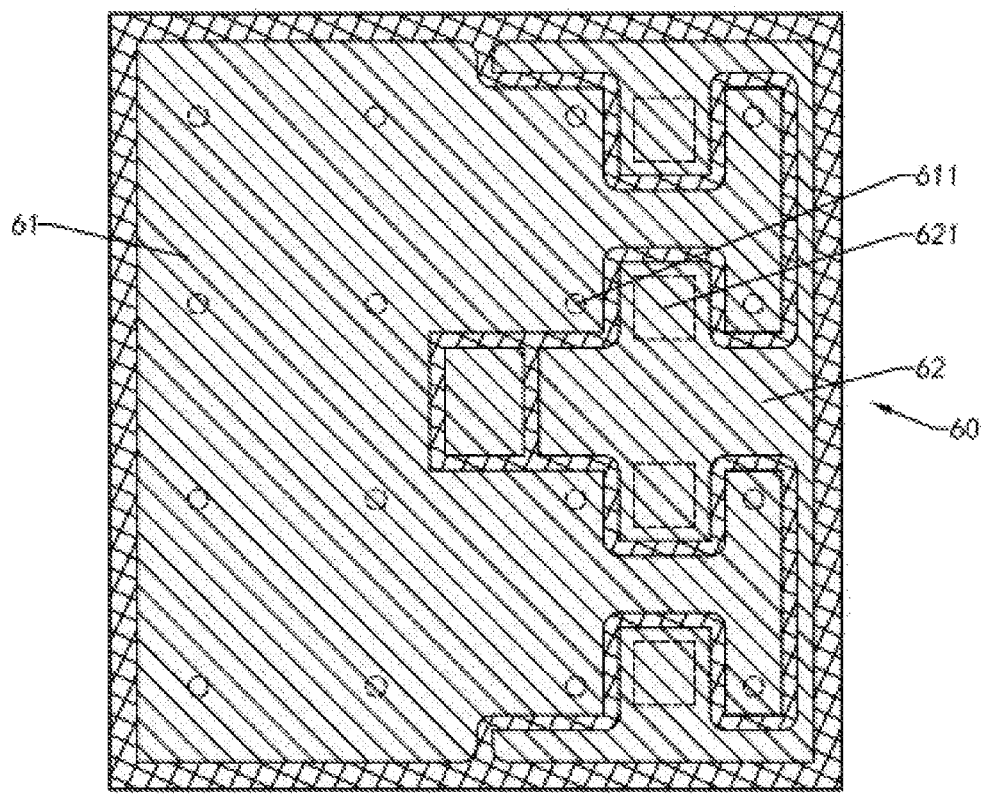
FIG. 10B is a top view illustrating the ninth step of the manufacturing process of the flip light emitting chip of according to the above preferred embodiment of the present invention.

Referring to FIGS. 10A and 10B, the extended electrode layer 60 comprises a first extended electrode portion 61 and a second extended electrode portion 62, wherein the first extended electrode portion 61 and the second extended electrode portion 62 are intervally and separately stacked on the first insulating layer 50. Also, the first extended electrode portion 61 is extended and electrically connected to the N-type semiconductor layer 21 of the extended stacking layer 20 through the first channel 51 of the first insulating layer 50, and the second extended electrode portion 62 is extended and electrically connected to the barrier layer 40 through the second channel 52 of the first insulating layer 50.

Specifically, the first extended electrode portion 61 comprises at least a first extended electrode pin 611 integrally extended in such a manner that when the first extended electrode portion 61 is formed and stacked on the first insulating layer 50, the first extended electrode pin 611 is formed and retained in the first channel 51 of the first insulating layer 50. At this time, the first extended electrode pin 611 directly contacts the N-type semiconductor layer 21 of the extended stacking layer 20, so as to ensure the first extended electrode portion 61 extending through the first channel 51 of the first insulating layer 50 to electrically connect with through the N-type semiconductor layer 21 of the extended stacking layer 20. Correspondingly, the second extended electrode portion 62 comprises at least a second extended electrode pin 621 integrally extended in such a manner that when the second extended electrode portion 62 is formed and stacked on the first insulating layer 50, the second extended electrode pin 621 is formed and retained in the second channel 52 of the first insulating layer 50. At this time, the second extended electrode pin 621 directly contacts the barrier layer 40 so as to ensure the second extended electrode portion 62 extending through the second channel 52 of the first insulating layer 50 to electrically connect with the barrier layer 40.

It is worth mentioning that the first extended electrode portion 61 and the second extended electrode portion 62 of the extended electrode layer 60 are made of metallic material, so as to ensure the first extended electrode portion 61 and the second extended electrode portion 62 having good electrical conductivities. For example, the first extended electrode portion 61 and the second extended electrode portion 62 are made of the material selected from the group consisting of gold (Au), aluminum (Al), cobalt (Co), platinum (Pt), titanium (Ti), chromium (Cr), and combinations thereof.

Figure 11A:
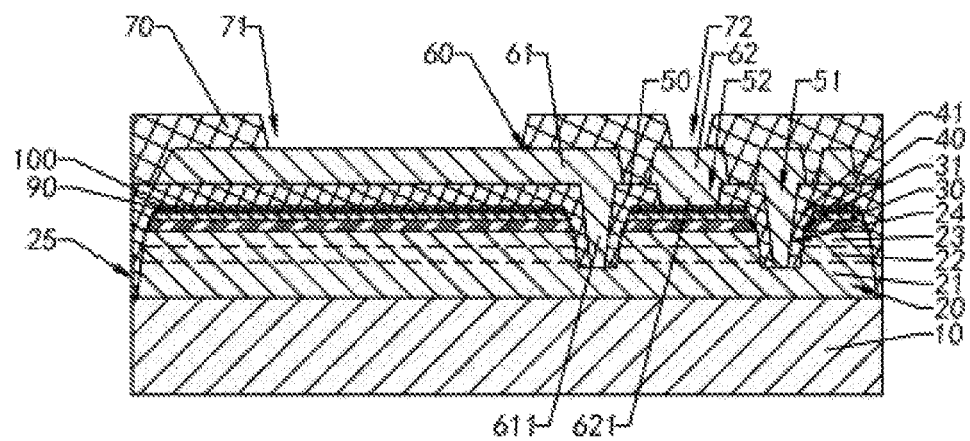
FIG. 11A is a sectional view illustrating the tenth step of the manufacturing process of the flip light emitting chip of according to the above preferred embodiment of the present invention.
Figure 11B:
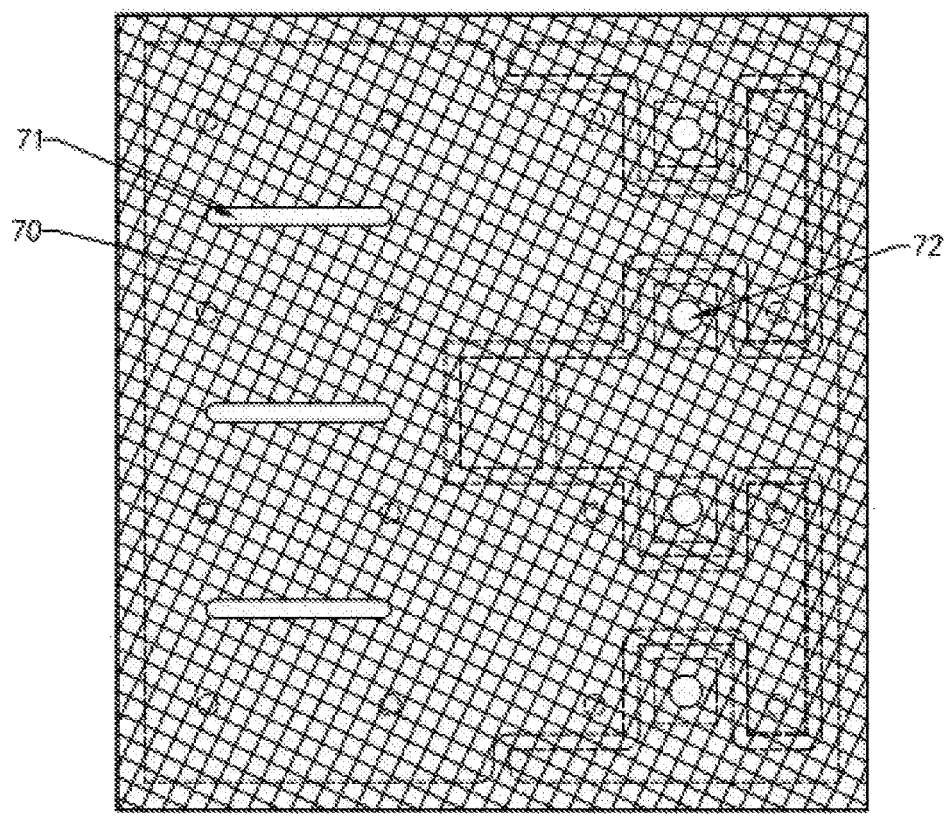
FIG. 11B is a top view illustrating the tenth step of the manufacturing process of the flip light emitting chip of according to the above preferred embodiment of the present invention.

Referring to FIGS. 11A and 11B, the second insulating layer 70 is formed and stacked on the first extended electrode portion 61 and the second extended electrode portion 62 of the extended electrode layer 60 and the first insulating layer 50, so as to isolate the first extended electrode portion 61 and the second extended electrode portion 62 by the second insulating layer 70. The second insulating layer 70 has at least a third channel 71 and at least a fourth channel 72 provided therein. The third channel 71 of the second insulating layer 70 is extended to the first extended electrode portion 61 of the extended electrode layer 60, so as to expose a portion of the surface of the first extended electrode portion 61 through the third channel 71 of the second insulating layer 70. The fourth channel 72 of the second insulating layer 72 is extended to the second extended electrode portion 62 of the extended electrode layer 60, so as to expose a portion of the surface of the second extended electrode portion 62 through the fourth channel 72 of the second insulating layer 70.

Preferably, the second insulating layer 70 and the first insulating layer 50 are formed of the same material, selected from the group consisting of silicon dioxide ($SiO_2$), silicon nitride (SiN), titanium dioxide ($TiO_2$), tantalum pentoxide ($Ta_2O_5$), magnesium fluoride (MgF), and combinations thereof.

Referring to FIGS. 12A and 12B, the electrode set 80 comprises an N-type electrode 81 and a P-type electrode 82, wherein the N-type electrode 81 and the P-type electrode 82 are respectively formed and stacked on the second insulating layer 70. The N-type electrode 81 is extended and electrically connected to the first extended electrode portion 61 of the extended electrode layer 60 through the third channel 71 of the second insulating layer 70. The P-type electrode 82 is extended and electrically connected to the second extended electrode portion 62 of the extended electrode layer 60 through the fourth channel 72 of the second insulating layer 70.

Specifically, the N-type electrode 81 comprises at least an N-type electrode connecting pin 811, wherein when the N-type electrode 81 is formed and stacked on the second insulating layer 70, the N-type electrode connecting pin 811 is formed and retained in the third channel 71 of the second insulating layer 70. In which, the N-type electrode connecting pin 811 directly contacts the first extended electrode portion 61, so as to ensure the N-type electrode 81 being extended and electrically connected to the first extended electrode portion 61 through the third channel 71 of the second insulating layer 70. Correspondingly, the P-type electrode 82 comprises at least a P-type electrode connecting pin 821, wherein when the P-type electrode 82 is formed and stacked on the second insulating layer 70, the P-type electrode connecting pin 821 is formed and retained in the fourth channel 72 of the second insulating layer 70. In which, the P-type electrode connecting pin 821 directly contacts the second extended electrode portion 62, so as to ensure the P-type electrode 82 being extended and electrically connected to the second extended electrode portion 62 through the fourth channel 72 of the second insulating layer 70.

It is worth mentioning that the N-type electrode 81 and the P-type electrode 82 are formed of metallic material, so as to ensure the N-type electrode 81 and the P-type electrode 82 having good electrical conductivity. For example, the N-type electrode 81 and the P-type electrode 82 are made of material selected from the group consisting of gold (Au), aluminum (Al), cobalt (Co), platinum (Pt), titanium (Ti), chromium (Cr), and combinations thereof.

Figure 13:
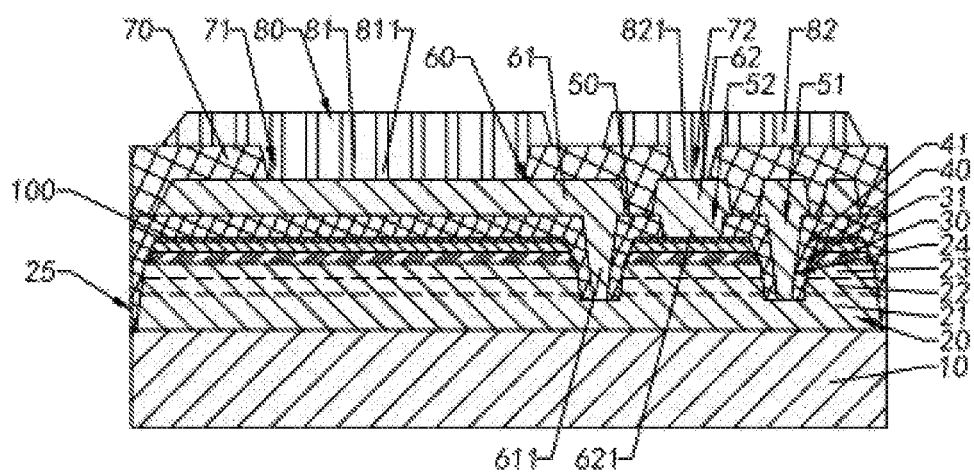
FIG. 13 is a sectional view illustrating a flip light emitting chip of according to an alternative mode of the above preferred embodiment of the present invention, which illustrates a sectional view of the flip light emitting chip.

FIG. 13 illustrates a sectional view of the flip light emitting chip according to an alternative mode of the preferred embodiment of the present invention, which is different with the flip light emitting chip as illustrated in FIGS. 12A-12B in that, after the barrier layer 40 is formed and stacked on the reflective layer 30 and the P-type semiconductor layer 23 of the extended stacking layer 20 for covering, enclosing, and wrapping the reflective layer 30, the bonding layer 100 is formed and stacked on the barrier layer 40, so as to have the bonding layer 100 covering, enclosing, and wrapping up the barrier layer 40. What is the same to the flip light emitting chip as illustrated in FIGS. 12A and 12B is that the flip light emitting chip according to this preferred embodiment as illustrated in FIG. 13 also uses titanium (Ti) or chromium (Cr) as the material to form and make the bonding layer 100. Thereafter, the first insulating layer 50 is formed and stacked on the bonding layer 100, so as to ensure the bonding layer 100 being formed and retained between the barrier layer 40 and the first insulating layer 50, such that the bonding layer 100 is able to enhance the binding force between the barrier layer 40 and the first insulating layer 50, which helps to ensure the reliability and stability of the flip light emitting chip.

According to another aspect of the present invention, the present invention further provides a manufacturing method of flip light emitting chip, comprising the following steps:

(a) forming an extended stacking layer 20 on a substrate 10;

(b) stacking a reflective layer 30 on a P-type semiconductor layer 23 of the extended stacking layer 20;

(c) stacking a barrier layer 40 on the P-type semiconductor layer 23 by covering and enclosing the reflective layer 30;

(d) stacking a bonding layer 100 on the barrier layer 40;

(e) stacking a first insulating layer 50 on the bonding layer 100, wherein the first insulating layer 50 has at least a first channel 51 and at least a second channel 52, wherein the first channel 51 is extended to the N-type semiconductor layer 21 of the extended stacking layer 20 and the second channel 52 is extended to the barrier layer 40;

(f) forming a first extended electrode pin 611 of the first extended electrode portion 61 in the first channel 51 of the first insulating layer 50 when stacking the first extended electrode portion 61 on the first insulating layer 50, wherein the first extended electrode pin 611 is electrically connected with the N-type semiconductor layer 21, wherein, correspondingly, forming the second extended electrode pin 621 of the second extended electrode portion 62 in the second channel 52 of the first insulating layer 50 during stacking the second extended electrode portion 62 on the first insulating layer 50, wherein the second extended electrode pin 621 is electrically connected with the barrier layer 40; and (g) respectively electrically connecting a N-type electrode 81 with the first extended electrode portion 61 and electrically connecting a P-type electrode 82 with the second extended electrode portion 62, so as to produce the flip light emitting chip.

Further, before the step (d), the manufacturing method further comprises a step of stacking the blockage layer 90 on the barrier layer 40, so as to stack the bonding layer 100 on the blockage layer 90 in the step (d).

Further, the step (e) further comprising the following steps:

(e.1) stacking the first insulating material base layer on the bonding layer 100; and (e.2) etching the first insulating material base layer so as to form the first insulating layer 50 having the first channel 51 and the second channel 52.

Further, in the step (e.2), the first insulating material base layer is segmentally etched to form the first channel 51. In the step (e.2), the first insulating material base layer is segmentally etched to form the second channel 52.

In the above manufacturing method of the present invention, firstly, the first insulating material base layer is etched, and then the interface layer which is formed on the N-type semiconductor layer 21 during the etching of the first insulating material base layer is etched to form the first channel 51 which is extended to the N-type semiconductor layer 21. In the above manufacturing method of the present invention, the first insulating material base layer is firstly etched, and then the interface layer which is formed on the barrier layer 40 during the etching of the first insulating material base layer is etched to form the second channel 52 which is extended to the barrier layer 40. Preferably, according to the above manufacturing method, the first insulating material base layer is firstly etched with a gaseous mixture of argon (Ar), trifluoromethane ($CHF_3$), and oxygen ($O_2$), and the interface layer is etched with a gaseous mixture of two or three of argon (Ar), chlorine ($Cl_2$), and boron trichloride ($BCl_3$).

Further, in the step (a), the P-type semiconductor layer 23 formed by etching the extended stacking layer 20 is extended from the extended stacking layer 20 to at least a semiconductor bare portion 24 of the N-type semiconductor layer 21 via the active region 22, wherein, in the step (c), a barrier layer perforation 41 is provided in the barrier layer 40 for connecting and communicating with the semiconductor bare portion 24, so as to allow the first insulating layer 50 is extended to the N-type semiconductor layer 21 via the barrier layer perforation 41 and the semiconductor bare portion 24 in the step (e).

Further, in the step (a), the extended stacking layer 20 is etched to form a substrate bare portion 25 which is extended from the P-type semiconductor layer 23 of the extended stacking layer 20 is extended to the substrate 10 via the active region 22 and the N-type semiconductor layer 21, so as to allow the first insulating layer 50 to be stacked on the substrate 10 through retaining on the substrate bare portion 25 in the step (e). Preferably, in the step (a), the extended stacking layer 20 is etched along the periphery thereof, such that, in the step (d), the first insulating layer 50 is stacked on the substrate to cover and enclose the periphery of the extended stacking layer 20.

Further, in the step (b), a portion of the surface of the P-type semiconductor layer 23 is exposed through the reflective layer perforation 31 of the reflective layer 30 and a periphery of the P-type semiconductor layer 23 is exposed along the periphery of the reflective layer 30, such that the barrier layer 40 is stacked on the portion of the surface of the portion of the surface of the P-type semiconductor layer 23 exposed through the reflective layer perforation 31 and the periphery of the P-type semiconductor layer 23 to cover and enclose the reflective layer 30.

Further, before the step (g), the manufacturing method further comprises a step of stacking at least one second insulating layer 70, which has at least one third channel 71 and at least one fourth channel 72, on the first extended electrode portion 61, the second extended electrode portion 62 and the first insulating layer 50, wherein the third channel 71 is extended to the first extended electrode portion 61 and the fourth channel 72 is extended to the second extended electrode portion 62, such that, in the step (g), when the N-type electrode 81 is stacked on the second insulating layer 70, the N-type electrode connecting pin 811 of the N-type electrode 81 is formed in the third channel 71 and electrically connected with the first extended electrode portion 61. Correspondingly, when the P-type electrode 82 is stacked on the second insulating layer 70, the P-type electrode connecting pin 821 of the P-type electrode 82 is formed in the fourth channel 72 and electrically connected with the second extended electrode portion 62.

It is worth to note that the thicknesses of the substrate 10, the N-type semiconductor layer 21, the active region 22, the P-type semiconductor layer 23, the reflective layer 30, the barrier layer 40, the blockage layer 90, the bonding layer 100, the first insulating layer 50, the first extended electrode portion 61, the second extended electrode portion 62, the second insulating layer 70, the N-type electrode 81, and the P-type electrode 82 of the flip light emitting chip as shown in the drawings of the present invention are simply examples for illustration, rather than the actual thicknesses of the substrate 10, the N-type semiconductor layer 21, the active region 22, the P-type semiconductor layer 23, the reflective layer 30, the barrier layer 40, the blockage layer 90, the bonding layer 100, the first insulating layer 50, the first extended electrode portion 61, the second extended electrode portion 62, the second insulating layer 70, the N-type electrode 81, and the P-type electrode 82. Besides, the actual ratios among the substrate 10, the N-type semiconductor layer 21, the active region 22, the P-type semiconductor layer 23, the reflective layer 30, the barrier layer 40, the blockage layer 90, the bonding layer 100, the first insulating layer 50, the first extended electrode portion 61, the second extended electrode portion 62, the second insulating layer 70, the N-type electrode 81, and the P-type electrode 82 may not be identical to what have been shown in the drawings. In addition, the ratios of the dimensions of the N-type electrode 81 and the P-type electrode 82 and the dimensions of other layers of the flip light emitting chip shall not be limited to what have been illustrated in the drawings.

Person skilled in the art should be able to understand that the above embodiments are just examples, wherein characteristics of various embodiments may also be interchanged and combined, so as to achieve implementations that are not specified in the drawings, but are easy to be thought of according to what have disclosed in the present invention.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A flip light-emitting chip, comprising:
   a substrate;
   an extended stacking layer formed on said substrate, wherein said extended stacking layer comprises an N-type semiconductor layer formed on said substrate, an active region formed on said N-type semiconductor layer, and a P-type semiconductor layer formed on said active region;
   a reflective layer formed on said P-type semiconductor layer;

a barrier layer, formed on said P-type semiconductor layer, covering said reflective layer;

a bonding layer formed on said barrier layer;

a first insulating layer formed on said bonding layer such that said bonding layer is retained between said barrier layer and said first insulating layer for enhancing a binding force between said barrier layer and said first insulating layer, wherein said first insulating layer has at least a pin-like first channel extended to said N-type semiconductor layer and at least a pin-like second channel extended to said barrier layer, wherein a portion of said first insulating layer extends to said N-type semiconductor layer to define said pin-like first channel and exposes a portion of said N-type semiconductor layer therethrough and a portion of said first insulating layer extends to said barrier layer to define said pin-like second channel and exposes a portion of a surface of said barrier layer therethrough;

an extended electrode layer, which comprises a first extended electrode portion and a second extended electrode portion, wherein said first extended electrode portion is formed on said first insulating layer and comprises at least a first extended electrode pin formed and retained in said pin-like first channel and electrically connected with said N-type semiconductor layer, wherein said second extended electrode portion is formed on said first insulating layer and comprises at least a second extended electrode pin formed and retained in said pin-like second channel and electrically connected with said barrier layer; and an electrode set, which comprises an N-type electrode and a P-type electrode, wherein said N-type electrode is electrically connected with said first extended electrode portion and said P-type electrode is electrically connected with said second extended electrode portion.

2. The flip light-emitting chip, as recited in claim 1, wherein a material of said bonding layer is selected from the group consisting of titanium (Ti) and Chromium (Cr).

3. The flip light-emitting chip, as recited in claim 1, wherein said extended stacking layer comprises at least a semiconductor bare portion, extended from said P-type semiconductor layer to said N-type semiconductor layer via said active region, wherein said barrier layer has at least a barrier layer perforation having a shape same as said semiconductor bare portion, wherein said semiconductor bare portion of said extended stacking layer is communicated and connected with said barrier layer perforation of said barrier layer, wherein said first insulating layer is extended to said N-type semiconductor layer via said barrier layer perforation of said barrier layer and said semiconductor bare portion of said extended stacking layer.

4. The flip light-emitting chip, as recited in claim 3, wherein said reflective layer has at least a reflective layer perforation, wherein said semiconductor bare portion of said extended stacking layer is corresponded to said reflective layer perforation of said reflective layer, wherein the size of said semiconductor bare portion of said extended stacking layer is smaller than the size of said reflective layer perforation, such that a portion of a surface of said P-type semiconductor layer is revealed in said reflective layer perforation, so as to allow said barrier layer be laminated on the surface of said P-type semiconductor layer that is revealed in said reflective layer perforation.

5. The flip light-emitting chip, as recited in claim 4, wherein a length and a width of said reflective layer is smaller than a length and a width of said P-type semiconductor layer, so as to expose a periphery of said P-type semiconductor layer to outside of said reflective layer through said reflective layer perforation of said reflective layer and allow said barrier layer to be formed on said exposed periphery of said P-type semiconductor layer.

6. The flip light-emitting chip, as recited in claim 1, wherein said extended stacking layer comprises at least a substrate bare portion extended from said P-type semiconductor layer to said substrate via said active region and said N-type semiconductor layer, wherein said first insulating layer is formed on said substrate through being retained on said substrate bare portion.

7. The flip light-emitting chip, as recited in claim 6, wherein said substrate bare portion is arranged to surround said extended stacking layer.

8. The flip light-emitting chip, as recited in claim 1, wherein each of said barrier layer and said reflective layer has a multiple stacking structure, wherein a minimum thickness of said barrier layer is between 0.1 μm and 3 μm which is thicker than a thickness of said reflective layer for 3 μm-15 μm formed at the portion that said barrier layer covers a sidewall of said reflective layer that defines said reflective layer perforation of said reflective layer.

9. The flip light-emitting chip, as recited in claim 8, wherein said barrier layer comprises a first barrier metallic material layer and a second barrier metallic material layer, wherein said first barrier metallic material layer on said P-type semiconductor layer of said extended stacking layer to cover said reflective layer and said second barrier metallic material layer is formed on said first barrier metallic material layer, wherein each of said first barrier metallic material layer and said second barrier metallic material layer is formed of material is formed of material selected from a group consisting of platinum (Pt), titanium (Ti), wolfram (W), nickel (Ni), and combinations thereof.

10. The flip light-emitting chip, as recited in claim 1, further comprising a second insulating layer formed on said first extended electrode portion, said second extended electrode portion and said first insulating layer, wherein said second insulating layer comprises at least a pin-like third channel extended to said first extended electrode portion and at least a pin-like fourth channel extended to said second extended electrode portion, wherein said N-type electrode is formed on said second insulating layer and comprises at least a N-type electrode connecting pin formed and retained in said pin-like third channel and electrically connected with said first extended electrode portion, wherein said P-type electrode is formed on said second insulating layer and comprises at least a P-type electrode connecting pin formed and retained in said pin-like fourth channel and electrically connected with said second extended electrode portion.

11. The flip light-emitting chip, as recited in claim 1, further comprising a blockage layer formed on an upper surface and side surfaces of said barrier layer so as to cover said barrier layer, wherein said bonding layer is formed on said blockage layer.

12. The flip light-emitting chip, as recited in claim 11, wherein said a material of said blockage layer is selected from the group consisting of nickel (Ni), platinum (Pt), zirconium (Zr), and combinations thereof.

13. The flip light-emitting chip, as recited in claim 2, further comprising a blockage layer formed on an upper surface and side surfaces of said barrier layer so as to cover said barrier layer, wherein said bonding layer is formed on said blockage layer, wherein a material of said blockage layer is selected from the group consisting of nickel (Ni), platinum (Pt), zirconium (Zr), and combinations thereof.

14. A manufacturing method of flip light-emitting chip, comprising steps of:
  (a) forming an extended stacking layer on a substrate;
  (b) forming a reflective layer on a P-type semiconductor layer of said extended stacking layer;
  (c) forming a barrier layer on said P-type semiconductor layer through covering said reflective layer;
  (d) forming a bonding layer on said barrier layer;
  (e) forming a first insulating layer on said bonding layer such that said bonding layer is retained between said barrier layer and said first insulating layer for enhancing a binding force between said barrier layer and said first insulating layer, wherein said first insulating layer has at least a channel which is a pin-like channel extended to an N-type semiconductor layer of said extended stacking layer and at least a second channel which is a pin-like channel extended to said barrier layer, wherein a portion of said first insulating layer extends to said N-type semiconductor layer to define said pin-like first channel and exposes a portion of said N-type semiconductor layer therethrough and a portion of said first insulating layer extends to said barrier layer to define said pin-like second channel and exposes a portion of a surface of said barrier layer therethrough;
  (f) forming a first extended electrode pin of said first extended electrode portion in said first channel of said first insulating layer when forming a first extended electrode portion on said first insulating layer, wherein said first extended electrode pin is electrically connected with said N-type semiconductor layer, and, correspondingly, forming a second extended electrode pin of said second extended electrode portion in said second channel of said first insulating layer when forming a second extended electrode portion on said first insulating layer, wherein said second extended electrode pin is electrically connected with said barrier layer; and
  (g) respectively electrically connecting an N-type electrode with said first extended electrode portion and electrically connecting a P-type electrode with said second extended electrode portion.

15. The manufacturing method, as recited in claim 14, wherein, before the step (d), the step (d) further comprises a step of forming a blockage layer on an upper surface and side surfaces of said barrier layer so as for forming said bonding layer on said blockage layer.

16. The manufacturing method, as recited in claim 14, wherein the step (e) further comprises the steps of:
  (e.1) forming a first insulating material base layer on said bonding layer; and
  (e.2) etching said first insulating material base layer, so as to form said first insulating layer having said first channel and said second channel.

17. The manufacturing method, as recited in claim 16, wherein the step (e.2) further comprises a step of segmentally etching said first insulating material base layer to form said first channel and said second channel.

18. The manufacturing method, as recited in claim 17, further comprising the steps of etching said first insulating material base layer and forming an interface layer on said N-type semiconductor layer when etching said first insulating material base layer, so as to form said first channel that is extended to said N-type semiconductor layer.

19. The manufacturing method, as recited in claim 17, further comprising the steps of etching said first insulating material base layer and etching to form said interface layer on said barrier layer when said first insulating material base layer is etched, so as to form said second channel that is extended to said barrier layer.

20. The manufacturing method, as recited in claim 18, wherein said first insulating material base layer is etched with a gaseous mixture of argon (Ar), trifluoromethane ($CHF_3$), and oxygen ($O_2$), and said interface layer is etched with a gaseous mixture of at least two of argon (Ar), chlorine ($Cl_2$) and boron trichloride ($BCl_3$).

21. The manufacturing method, as recited in claim 14, wherein, in the step (a), said P-type semiconductor layer formed by etching said extended stacking layer is extended from said extended stacking layer to at least a semiconductor bare portion of said N-type semiconductor layer via an active region, wherein in the step (c), a barrier layer perforation is provided in said barrier layer for connecting and communicating with said semiconductor bare portion, such that, in the step (e), said first insulating layer is extended to said N-type semiconductor layer via said barrier layer perforation and said semiconductor bare portion.

22. The manufacturing method, as recited in claim 21, wherein in the step (a), said extended stacking layer is etched to form a substrate bare portion extended from said P-type semiconductor layer of said extended lamination to said substrate via said active region and said N-type semiconductor layer, such that, in the step (e), said first insulating layer is formed on said substrate through retaining on said substrate bare portion.

23. The manufacturing method, as recited in claim 22, wherein, in the step (a), said extended stacking layer is etched along a periphery thereof, such that, in the step (e), said first insulating layer is formed on said substrate to cover a periphery of said extended stacking layer.

24. The manufacturing method, as recited in claim 21, wherein in the step (b), a portion of a surface of said P-type semiconductor layer is exposed through a reflective layer perforation of said reflective layer and a periphery of said P-type semiconductor layer is exposed along a periphery of said reflective layer, such that said barrier layer is formed to cover said reflective layer through being formed on said portion of said surface of said P-type semiconductor layer, which is exposed through said reflective layer perforation, and said periphery of said P-type semiconductor layer.

25. The manufacturing method, as recited in claim 21, before the step (g), further comprising steps of forming a second insulating layer, which has at least a third channel and at least a fourth channel, on said first extended electrode portion, said second extended electrode portion and said first insulating layer, wherein said third channel is a pin-like channel extended to said first extended electrode portion and said fourth channel is a pin-like channel extended to said second extended electrode portion, such that, in the step (g), an N-type electrode connecting pin of said N-type electrode is formed in said third channel and electrically connected with said first extended electrode portion when said N-type electrode is formed on said second insulating layer, and, correspondingly, a P-type electrode connecting pin of said P-type electrode is formed in said fourth channel and electrically connected with said second extended electrode portion when said P-type electrode is formed on said second insulating layer.

* * * * *